United States Patent
Lin et al.

(10) Patent No.: US 12,205,999 B2
(45) Date of Patent: Jan. 21, 2025

(54) METAL-OXIDE THIN-FILM TRANSISTOR AND METHOD FOR FABRICATING SAME, DISPLAY PANEL, AND DISPLAY DEVICE

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Bin Lin, Beijing (CN); Liangliang Li, Beijing (CN); Zheng Liu, Beijing (CN); Bo Hu, Beijing (CN); Rui Zhang, Beijing (CN); Xinlin Peng, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/907,839

(22) PCT Filed: Aug. 31, 2021

(86) PCT No.: PCT/CN2021/115779
§ 371 (c)(1),
(2) Date: Aug. 29, 2022

(87) PCT Pub. No.: WO2023/028872
PCT Pub. Date: Mar. 9, 2023

(65) Prior Publication Data
US 2024/0194747 A1    Jun. 13, 2024

(51) Int. Cl.
*H01L 29/417* (2006.01)
*H01L 27/12* (2006.01)
(Continued)

(52) U.S. Cl.
CPC .... *H01L 29/41733* (2013.01); *H01L 27/1214* (2013.01); *H01L 29/04* (2013.01); *H01L 29/6675* (2013.01); *H01L 29/78642* (2013.01)

(58) Field of Classification Search
CPC .......... H01L 29/41733; H01L 27/1214; H01L 29/04; H01L 29/6675; H01L 29/78642; H01L 29/45; H01L 29/7869
See application file for complete search history.

(56) References Cited

U.S. PATENT DOCUMENTS

2011/0297930 A1    12/2011    Choi et al.
2014/0001467 A1    1/2014    Yamazaki et al.
(Continued)

FOREIGN PATENT DOCUMENTS

CN    1760743 A    4/2006
CN    102157387 A    8/2011
(Continued)

*Primary Examiner* — Mohammed R Alam
(74) *Attorney, Agent, or Firm* — Lippes Mathias LLP

(57) ABSTRACT

Provided is a metal-oxide thin-film transistor. The metal-oxide thin-film transistor includes a gate, a gate insulation layer, a metal-oxide semiconductor layer, a source electrode, a drain electrode, and a passivation layer that are successively disposed on a base substrate; wherein the source electrode and the drain electrode are both in a laminated structure, wherein the laminated structure of the source electrode or the drain electrode at least includes a bulk metal layer and an electrode protection layer; wherein the electrode protection layer includes a metal or a metal alloy; the electrode protection layer is at least disposed between the metal-oxide semiconductor layer and the bulk metal layer; wherein a metal-oxide layer is disposed between the electrode protection layer and the bulk metal layer.

20 Claims, 8 Drawing Sheets

(51) Int. Cl.
    *H01L 29/04*     (2006.01)
    *H01L 29/66*     (2006.01)
    *H01L 29/786*     (2006.01)

(56) References Cited

U.S. PATENT DOCUMENTS

| | | |
|---|---|---|
| 2015/0129868 A1 | 5/2015 | Kim et al. |
| 2015/0171154 A1 | 6/2015 | Kang |
| 2016/0027811 A1 | 1/2016 | Li et al. |
| 2016/0197295 A1* | 7/2016 | Lee .................. H01L 29/4908 438/155 |
| 2016/0322507 A1 | 11/2016 | Choi et al. |
| 2018/0025913 A1 | 1/2018 | Yamazaki et al. |
| 2018/0331228 A1* | 11/2018 | Oikawa ............. H01L 29/78696 |
| 2021/0043660 A1 | 2/2021 | Wang et al. |

FOREIGN PATENT DOCUMENTS

| | | |
|---|---|---|
| CN | 102270644 A | 12/2011 |
| CN | 103094352 A | 5/2013 |
| CN | 103715269 A | 4/2014 |
| CN | 103985639 A | 8/2014 |
| CN | 104395991 A | 3/2015 |
| CN | 104716143 A | 6/2015 |
| CN | 110429024 A | 11/2019 |
| CN | 111403337 A | 7/2020 |

* cited by examiner

METAL-OXIDE THIN-FILM TRANSISTOR AND METHOD FOR FABRICATING SAME, DISPLAY PANEL, AND DISPLAY DEVICE

CROSS-REFERENCE TO RELATED APPLICATION

This application is a 371 of PCT application No. PCT/CN2021/115779, filed on Aug. 31, 2021, the content of which is incorporated herein by reference in its entirety.

TECHNICAL FIELD

The present disclosure relates to the field of display technologies, and in particular, relates to a metal-oxide thin-film transistor and a method for fabricating the same, a display panel, and a display device.

BACKGROUND

Thin film transistors (TFT) are core devices of display apparatuses, and each of pixels in the display apparatus is turned on, turned off, or driven based on the thin film transistors. Metal-oxide thin-film transistors, with high mobility, may improve resolutions of the display apparatuses, and have been widely used in the display apparatuses.

SUMMARY

Embodiments of the present disclosure provide a metal-oxide thin-film transistor and a method for fabricating the same, a display panel, and a display device. The technical solutions are as follows.

In one aspect, a metal-oxide thin-film transistor is provided in the present disclosure. The metal-oxide thin-film transistor includes: a gate, a gate insulation layer, a metal-oxide semiconductor layer, a source electrode, a drain electrode, and a passivation layer that are successively disposed on a base substrate; wherein the source electrode and the drain electrode are both in a laminated structure, the laminated structure of the source electrode or the drain electrode at least comprising a bulk metal layer and an electrode protection layer; wherein the electrode protection layer is disposed on at least one side of the bulk metal layer, and the electrode protection layer comprises a metal or a metal alloy; the electrode protection layer of the source electrode or the drain electrode is at least disposed between the metal-oxide semiconductor layer and the bulk metal layer; and a metal-oxide layer is disposed between the electrode protection layer of the source electrode or the drain electrode and the bulk metal layer of the source electrode or the drain electrode, a metal element of the metal-oxide layer comprising at least one of a metal element of the bulk metal layer and a metal element of the electrode protection layer; wherein a thickness of the metal-oxide layer of the source electrode or the drain electrode is not greater than 2% of a thickness of any one of the source electrode and the drain electrode, and the thickness of the metal-oxide layer of the source electrode or the drain electrode is not greater than 10% of a thickness of the electrode protection layer.

In one implementation of the embodiments of the present disclosure, the thickness of the metal-oxide layer of the source electrode or the drain electrode is not greater than 0.5% of the thickness of any one of the source electrode and the drain electrode; and the thickness of the metal-oxide layer of the source electrode or the drain electrode is not greater than 8% of the thickness of the electrode protection layer.

In one implementation of the embodiments of the present disclosure, the thickness of the metal-oxide layer of the source electrode or the drain electrode is greater than 3 nm.

In one implementation of the embodiments of the present disclosure, an oxygen element in the metal-oxide layer of the source electrode or the drain electrode is distributed between the electrode protection layer and the bulk metal layer, and the oxygen element is distributed within a predetermined thickness, the predetermined thickness being the thickness of the metal-oxide layer; the metal-oxide layer of the source electrode is a film layer of a metal oxide distributed in a direction away from the drain electrode, and the farther away from the drain electrode, the less the thickness of the metal oxide; and/or the metal-oxide layer of the drain electrode is a film layer of a metal oxide distributed in a direction away from the source electrode, the farther away from the source electrode, the less the thickness of the metal oxide.

In one implementation of the embodiments of the present disclosure, a portion of the metal oxide protruding from a side edge of the source electrode or the drain electrode to a portion between the electrode protection layer and the main metal layer does not exceed the edge of the electrode protection layer.

In one implementation of the embodiments of the present disclosure, in a length direction of a channel, a portion of the metal oxide protruding to a portion between a top of the electrode protection layer and a bottom of the main metal layer and extending towards interior does not exceed the edge of the electrode protection layer.

In one implementation of the embodiments of the present disclosure, the electrode protection layer of the source electrode or the drain electrode includes a first portion and a second portion that are connected; wherein the first portion and the second portion are both disposed on a side of the metal-oxide semiconductor layer; and in a direction perpendicular to a face of the base substrate, the second portion is disposed above the first portion, and a slope angle of the first portion is greater than a slope angle of the second portion.

In one implementation of the embodiments of the present disclosure, the slope angle of the first portion ranges from 80° to 100°, and the slope angle of the second portion ranges from 30° to 60°.

In one implementation of the embodiments of the present disclosure, a thickness of the first portion is less than a thickness of the second portion.

In one implementation of the embodiments of the present disclosure, the metal-oxide semiconductor layer includes a first sub-metal-oxide semiconductor layer and a second sub-metal-oxide semiconductor layer that are laminated; wherein the first sub-metal-oxide semiconductor layer is disposed between the base substrate and the second sub-metal-oxide semiconductor layer; a crystallinity degree of the first sub-metal-oxide semiconductor layer is less than a crystallinity degree of the second sub-metal-oxide semiconductor layer; and the first portion is attached to a side of the first sub-metal-oxide semiconductor layer, and the second portion is attached to a side of the second sub-metal-oxide semiconductor layer.

In one implementation of the embodiments of the present disclosure, the side of the first sub-metal-oxide semiconductor layer is a planar face, or the side of the first sub-metal-oxide semiconductor layer is a curved face.

In one implementation of the embodiments of the present disclosure, the first sub-metal-oxide semiconductor layer includes an amorphous metal oxide or a nanocrystal metal oxide, and the second sub-metal-oxide semiconductor layer includes a c-axis crystal metal oxide.

In one implementation of the embodiments of the present disclosure, an atom content of an oxygen element in the metal-oxide semiconductor layer ranges from 50% to 70%.

In one implementation of the embodiments of the present disclosure, the passivation layer includes a first sub-passivation layer and a second sub-passivation layer that are laminated; wherein the first sub-passivation layer is disposed between the metal-oxide semiconductor layer and the second sub-passivation layer; and an atom content of a hydrogen element in the first sub-passivation layer ranges from 2.5% to 3%, a content of oxygen-silicon bonds in the second sub-passivation layer is less than 7%, and a peak bond energy of oxygen-silicon bonds in the first sub-passivation layer is greater than 1060 $cm^{-1}$ and is not greater than 1080 $cm^{-1}$.

In one implementation of the embodiments of the present disclosure, the laminated structure includes two electrode protection layers; wherein the two electrode protection layers are disposed on two opposite side faces of the bulk metal layer respectively; and the electrode protection layer is a molybdenum-niobium layer, and the bulk metal layer is a copper layer.

In one implementation of the embodiments of the present disclosure, the thickness of the electrode protection layer ranges from 20 nm to 30 nm, and a thickness of the bulk metal layer ranges from 400 nm to 600 nm.

In one implementation of the embodiments of the present disclosure, a metal oxide in the metal-oxide semiconductor layer includes at least one of indium, gallium, zinc, stannum, and praseodymium.

In one implementation of the embodiments of the present disclosure, the metal oxide includes an indium gallium zinc oxide, wherein a ratio of indium, gallium, and zinc is 4:2:3, 1:3:6, or 1:1:1.

In another aspect, a method for fabricating a metal-oxide thin-film transistor is provided in the present disclosure. The method includes providing a base substrate; forming a gate, a gate insulation layer, a metal-oxide semiconductor layer, a source electrode, a drain electrode, and a passivation layer on the base substrate in sequence, wherein the source electrode and the drain electrode are both in a laminated structure, the laminated structure of the source electrode or the drain electrode at least including a bulk metal layer and an electrode protection layer; wherein the electrode protection layer is disposed on at least one side of the bulk metal layer, and the electrode protection layer includes a metal or a metal alloy; the electrode protection layer of the source electrode or the drain electrode is at least disposed between the metal-oxide semiconductor layer and the bulk metal layer; and a metal-oxide layer is disposed between the electrode protection layer of the source electrode or the drain electrode and the bulk metal layer of the source electrode or the drain electrode, a metal element of the metal-oxide layer including at least one of a metal element of the bulk metal layer and a metal element of the electrode protection layer, a thickness of the metal-oxide layer of the source electrode or the drain electrode being not greater than 2% of a thickness of any one of the source electrode and the drain electrode, and the thickness of the metal-oxide layer of the source electrode or the drain electrode being not greater than 10% of a thickness of the electrode protection layer.

In one implementation of the embodiments of the present disclosure, forming the metal-oxide semiconductor layer includes: depositing one layer of first metal-oxide semiconductor thin film on a side, distal from the base substrate, of the gate insulation layer, wherein the first metal-oxide semiconductor thin film includes a nanocrystal metal oxide, a temperature for depositing the first metal-oxide semiconductor thin film ranges from 100° C. to 200° C., a content of an oxygen element in a deposition gas ranges from 1% to 30%, and a deposition power ranges from 10 kW to 40 kW; depositing one layer of second metal-oxide semiconductor thin film on a side, distal from the base substrate, of the first metal-oxide semiconductor thin film, wherein the second metal-oxide semiconductor thin film includes a c-axis crystal metal oxide, a temperature for depositing the second metal-oxide semiconductor thin film ranges from 100° C. to 300° C., a content of an oxygen element in a deposition gas ranges from 80% to 100%, and a deposition power ranges from 10 kW to 40 kW; and forming the metal-oxide semiconductor layer by patterning the first metal-oxide semiconductor thin film and the second metal-oxide semiconductor thin film.

In one implementation of the embodiments of the present disclosure, forming the source electrode and the drain electrode includes: forming one layer of first electrode protection thin film on a side, distal from the base substrate, of the metal-oxide semiconductor layer, wherein a thickness of the first electrode protection thin film is less than 25 nm; forming one layer of bulk metal thin film on a side, distal from the base substrate, of the first electrode protection thin film; forming one layer of second electrode protection thin film on a side, distal from the base substrate, of the bulk metal thin film; and forming the source electrode and the drain electrode by patterning the first electrode protection thin film, the bulk metal thin film, and the second electrode protection thin film by a wet etching process.

In one implementation of the embodiments of the present disclosure, forming the passivation layer includes: forming a first insulation film on the base substrate using a chemical vapor deposition apparatus upon introducing nitrous oxide and silane into a reaction chamber, wherein a thickness of the first insulation film ranges from 50 nm to 200 nm; in forming the first insulation film, a deposition power of the chemical vapor deposition apparatus ranges from 6 kW to 10 KW, a deposition pressure of the chemical vapor deposition apparatus is less than 1000 mtorr, a temperature for the base substrate is less than 230° C., and a ratio of a content of the nitrous oxide to a content of the silane is greater than 80; and the first insulation film forms a first sub-passivation layer; and forming a second insulation film on the first insulation film using the chemical vapor deposition apparatus upon introducing silane and an ammonia gas into the reaction chamber, wherein a thickness of the second insulation film is less than 100 nm; in forming the second insulation film, a deposition power of the chemical vapor deposition apparatus ranges from 6 kW to 10 KW, a deposition pressure of the chemical vapor deposition apparatus is less than 1000 mtorr, a temperature for the base substrate is greater than 280° C.; and the second insulation film forms a second sub-passivation layer, and the first sub-passivation layer and the second sub-passivation layer form the passivation layer.

In another aspect, a display panel is provided in the present disclosure. The display panel includes a base substrate, and a plurality of metal-oxide thin-film transistors disposed on the base substrate.

In another aspect, a display device is provided in the present disclosure. The display device includes a power supply assembly, and a display panel, wherein the power supply assembly is configured to supply power to the display panel.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

Figure 1:
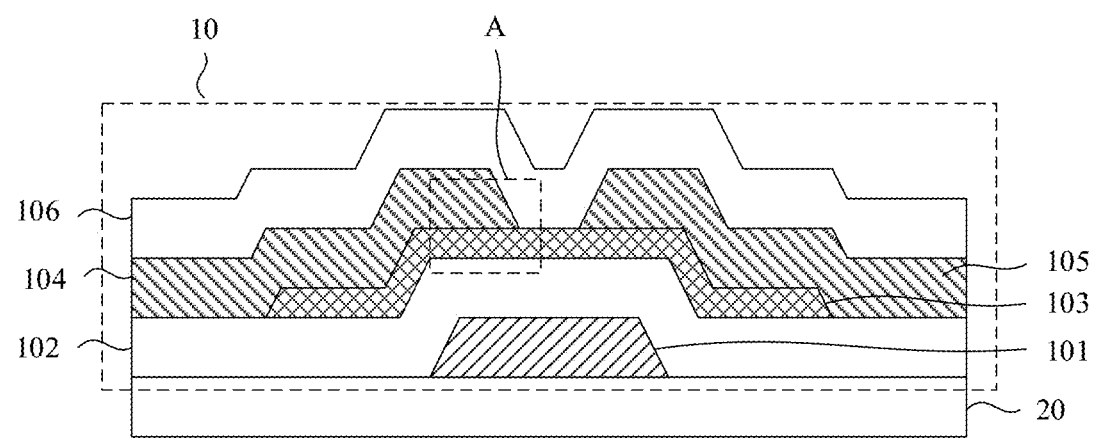
FIG. 1 is a schematic structural diagram of a metal-oxide thin-film transistor according to an embodiment of the present disclosure.

For clearer descriptions of the objectives, technical solutions, and advantages in the present disclosure, the embodiments of the present disclosure are described in detail hereinafter in combination with the accompanying drawings.

In the related art, an oxide thin film transistor includes a gate, a gate insulation layer, a metal-oxide semiconductor layer, a source electrode, a drain electrode, and a passivation layer that are laminated on a base substrate. The source electrode and the drain electrode are disposed in the same layer, and the source electrode and the drain electrode are both in a laminated structure. The laminated structure includes a bulk metal layer and an electrode protection layer, and the electrode protection layer is disposed between the metal-oxide semiconductor layer and the bulk metal layer.

However, in fabricating the oxide thin film transistor, the electrode protection layer and the bulk metal layer may be oxidized, such that a metal-oxide layer is formed between the electrode protection layer and the bulk metal layer. In the subsequent process of fabricating the passivation layer, hydrogen bonds in the passivation layer may enter into the metal-oxide layer to react with the metal oxides, such that the hydrogen bonds in the passivation layer are reduced, and the water and oxygen resistance of the passivation layer is further reduced. Impurities, such as water vapor, hydrogen, and the like, may be more prone to enter into the metal-oxide semiconductor layer through the passivation layer, and the metal-oxide semiconductor in the metal-oxide semiconductor layer may be reacted with the impurities, such that oxygen vacancies are formed, and the stability of the metal-oxide thin-film transistor may be affected.

In the metal-oxide thin-film transistor, a control of the stability of the metal-oxide thin-film transistor is important. Factors affecting the stability include a control of the target or process conditions for fabricating the metal-oxide semiconductor, and a control of film layers contacted with the metal-oxide semiconductor, such as the metal-oxide layer and the passivation layer. The control of the quality of these film layers is important.

The stability of the metal-oxide thin-film transistor should be controlled to satisfy the requirements, and a mass production yield and an effect of the mass production on the stability should be considered, so as to improve the yield. For example, the electrode protection layer contacted with the metal-oxide semiconductor layer is not cracked in annealing in the case that a deposition rate and the film quality of the electrode protection layer satisfy the requirements.

Part or all of above technical questions may be optimized in the limited embodiments of the present disclosure hereinafter.

The metal-oxide thin-film transistor in the embodiments of the present disclosure is used in display regions or gate on array (GOA) regions.

The metal-oxide thin-film transistor in the embodiments of the present disclosure may be used in a small-sized mobile device, a notebook (NB), a portable android device (PAD), a small and medium sized monitor (MNT), a large and medium sized television (TV), a display screen, and the like.

The metal-oxide thin-film transistor in the embodiments of the present disclosure may be used in the field of display or chips (may be the technical fields, such as a liquid crystal display (LCD), an Organic Light Emitting Diode (OLED), a quantum dot light emitting diodes (QLED) display, a micro light emitting diode (Micro LED) display, a sense, and the like), and taken as a pixel switch TFT, a GOA, or a TFT in the pixel drive circuit.

The thin film transistor in the embodiments of the present disclosure shows significant effects in fabricating products in a bottom gate back channel etched (BCE) structure, which is not limited in the products in the structure.

The present disclosure is illustrated by taking the bottom gate BCE structure as an example.

FIG. 1 is a schematic structural diagram of a metal-oxide thin-film transistor according to an embodiment of the present disclosure. Referring to FIG. 1, the metal-oxide thin-film transistor 10 includes a gate 101, a gate insulation layer (GI) 102, a metal-oxide semiconductor layer 103, a source electrode 104, a drain electrode 105, and a passivation layer (PVX) 106 that are successively disposed on a base substrate 20. The source electrode 104 and the drain electrode 105 are in the same layer, and are connected to the metal-oxide semiconductor layer 103.

In the embodiments of the present disclosure, the term "the same layer" means a relationship of layers formed in the same process. In the case that the source electrode 104 and the drain electrode 105 are formed by performing one or more processes of patterning in the same layer material, the source electrode 104 and the drain electrode 105 are in the same layer. In another example, the source electrode 104 and the drain electrode 105 may be formed in the same layer by simultaneously performing the process of forming the source electrode 104 and the process of forming the drain electrode 105. The term "the same layer" does not mean that thicknesses of the layers or layers in the cross-sectional view are the same.

Figure 2:
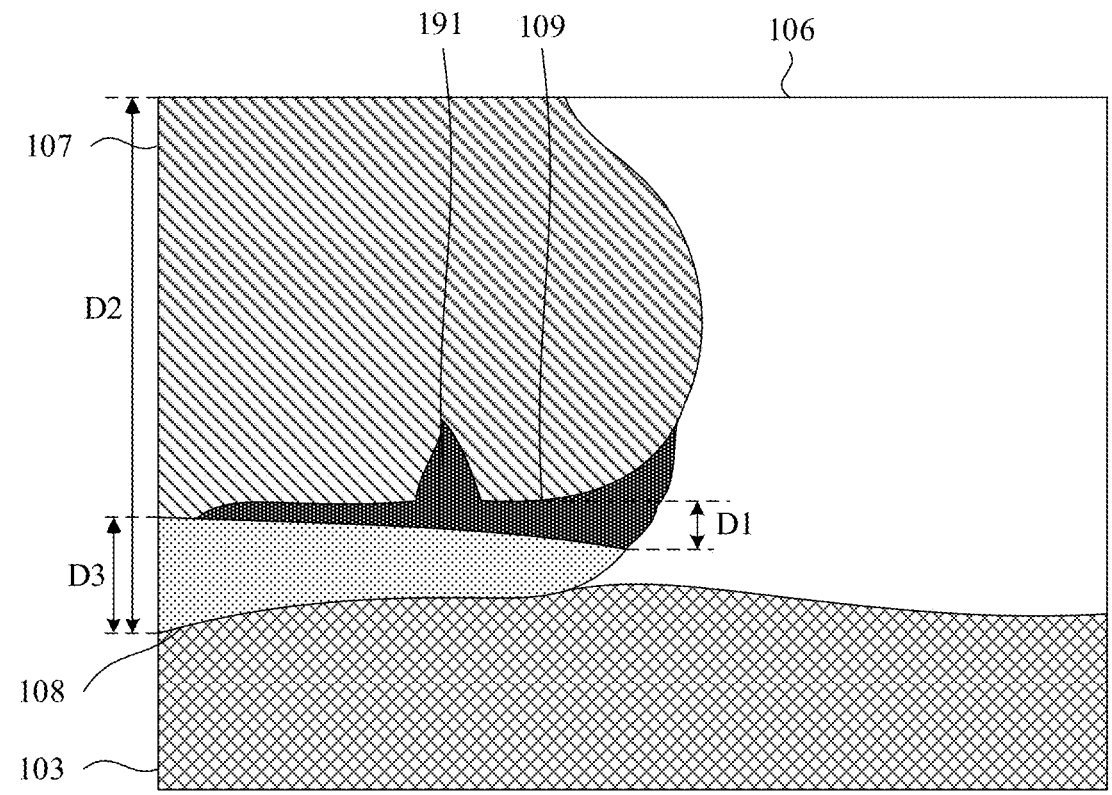
FIG. 2 is an enlarged view of a possible structure in a region A shown in FIG. 1.

In the embodiments of the present disclosure, the source electrode 104 and the drain electrode 105 are both in a laminated structure. FIG. 2 is an enlarged view of a possible structure in a region A shown in FIG. 1. Referring to FIG. 2, the laminated structure at least includes a bulk metal layer 107 and an electrode protection layer 108. The electrode protection layer 108 is disposed on at least one side of the bulk metal layer 107, and the electrode protection layer 108 includes a metal or a metal alloy. The electrode protection layer 108 is at least disposed between the metal-oxide semiconductor layer 103 and the bulk metal layer 107. A metal-oxide layer 109 is disposed between the electrode protection layer 108 and the bulk metal layer 107, and a metal element of the metal-oxide layer 109 includes at least one of a metal element of the bulk metal layer 107 and a metal element of the electrode protection layer 108.

In the embodiments of the present disclosure, the metal-oxide layer 109 is for any one of the source electrode 104 and the drain electrode 105.

Illustratively, the bulk metal layer is copper, aluminum, and the like, and the electrode protection layer is titanium or an alloy.

The electrode protection layer is disposed on a side of the copper or the aluminum to protect the copper or the aluminum from affecting the electric properties after being severely oxidized.

As both the electrode protection layer 108 and the bulk metal layer 107 include the metal element, the metal element may be oxidized to form the metal-oxide layer 109 in fabricating process, and the metal element in the metal-oxide layer 109 may include at least one of the metal element of the bulk metal layer 107 and the metal element of the electrode protection layer 108. The adhesion is present between the electrode protection layer 108 and the bulk metal layer 107, and channels or gaps are present between the electrode protection layer 108 and the bulk metal layer 107. Therefore, oxygen is prone to enter the portion between the electrode protection layer 108 and the bulk metal layer 107, and the oxygen is reacted with the metal or the alloy to form the metal oxide, that is, the metal-oxide layer 109.

In the embodiments of the present disclosure, a thickness D1 of the metal-oxide layer 109 is not greater than 2% of a thickness D2 of any one of the source electrode 104 and the drain electrode 105. For example, assuming that the thickness of the source electrode 104 is A, the thickness of the drain electrode 105 is B, and A is less than or equal to B, the thickness D1 of the metal-oxide layer 109 is less than or equal to 2% of A. In addition, the thickness D1 of the metal-oxide layer 109 is not greater than 10% of a thickness D3 of the electrode protection layer 108.

The control of thinner metal-oxide layer 109 has the following advantages.

(1) Taking the metal-oxide transistor being an indium gallium zinc oxide (IGZO) as an example, as intrinsic electrons in the IGZO film layer possess great migration capability, and a number of the oxygen vacancies affects the overall properties and the stability, the control of the oxygen vacancies in the IGZO is important. In addition, the IGZO is susceptible to external water vapor or hydrogen ions to capture H and form oxygen vacancies, such that carriers are increased, and shiny sand mura may be formed in the panel caused by the negatively biased properties. Therefore, the control of the injection of the H and O is important. In general, as part of H may be overflowed upon annealing, and the O may be overflowed simultaneously, the fabricated metal-oxide semiconductor layer is generally oxygen supplemented.

Most O in the metal-oxide layer 109 enters in annealing the passivation layer or oxygen supplementing the metal-oxide semiconductor layer. A part or most of the O is diffused downward to enter into the metal-oxide semiconductor layer, and a part of the O remains in the electrode protection layer to enter into the electrode protection layer. The entrance of the part of the O may absorb nearby H, and the O and H may form slight $H_2O$ to avoid or stop the downward diffusion and the entrance into the metal-oxide semiconductor layer of H, such that more O may enter into the metal-oxide semiconductor layer, and a purpose of sufficient oxygen supplementation is achieved. However, in the case that excessive O enter into the electrode protection layer, and grater $H_2O$ are formed from the O and H, the electrode protection layer or the bulk metal layer may be corroded by $H_2O$. The corrosion of the electrode may cause the failure of the TFT and the poor of the products such as shiny sand mura.

(2) In the embodiments of the present disclosure, the thickness D1 of the metal-oxide layer 109 is defined as not greater than 2% of the thickness D2 of any one of the source electrode 104 and the drain electrode 105, and the thickness D1 of the metal-oxide layer 109 is not greater than 10% of the thickness D3 of the electrode protection layer 108. A total amount of the metal-oxide layer 109 in the metal-oxide thin-film transistor is less. Within the thickness range, the amount of metal oxides being oxidized or reduced in forming the passivation layer 106 is controlled, and the amount of H reacted in the redox reaction is reduced. The loss of hydrogen bonds in the passivation layer 106 is reduced, such that the effect on the water and oxygen resistance of the passivation layer 106 is reduced.

In the embodiments of the present disclosure, the reduction of the stability of the metal-oxide thin-film transistor means negatively biased properties of the metal-oxide thin-film transistor, such as an increased drift of a threshold voltage, an increase of a leak current, and the like.

In one implementation of the embodiments of the present disclosure, the thickness D1 of the metal-oxide layer 109 is not greater than 0.5% of the thickness D2 of any one of the source electrode 104 and the drain electrode 105, and the thickness D1 of the metal-oxide layer 109 is not greater than 8% of the thickness D3 of the electrode protection layer 108.

By defining the thickness D1 of the metal-oxide layer 109, the metal-oxide layer 109 is further thinner, such that the total amount of the metal oxides reacted in the redox reaction in the metal-oxide thin-film transistor is further reduced, which is beneficial for improving the stability of the metal-oxide thin-film transistor.

Illustratively, the thickness D1 of the metal-oxide layer 109 is 0.3% of the thickness D2 of any one of the source electrode 104 and the drain electrode 105, and the thickness D1 of the metal-oxide layer 109 is 6% of the thickness D3 of the electrode protection layer 108.

In the embodiments of the present disclosure, the thickness of the metal-oxide layer 109 is not greater than 3 nm. It is confirmed by measurements that the requirements of fabricating the metal-oxide thin-film transistor and property requirements of metal-oxide thin-film transistor may be satisfied in the case that the thickness of the metal-oxide layer 109 is not greater than 3 nm.

Illustratively, the thickness of the metal-oxide layer 109 is 1.5 nm.

In above embodiments of the present disclosure, the thickness D1 of the metal-oxide layer 109 is a mean thickness or a maximum thickness of the metal-oxide layer.

It is noted that, in the embodiments of the present disclosure, the thickness of the metal-oxide layer 109 means the thickness of the metal oxides in 80% region, does not include the thickness of the discontinuity regions or the thickness of the metal oxides exposed and not covered by the bulk metal layer.

Figure 3:
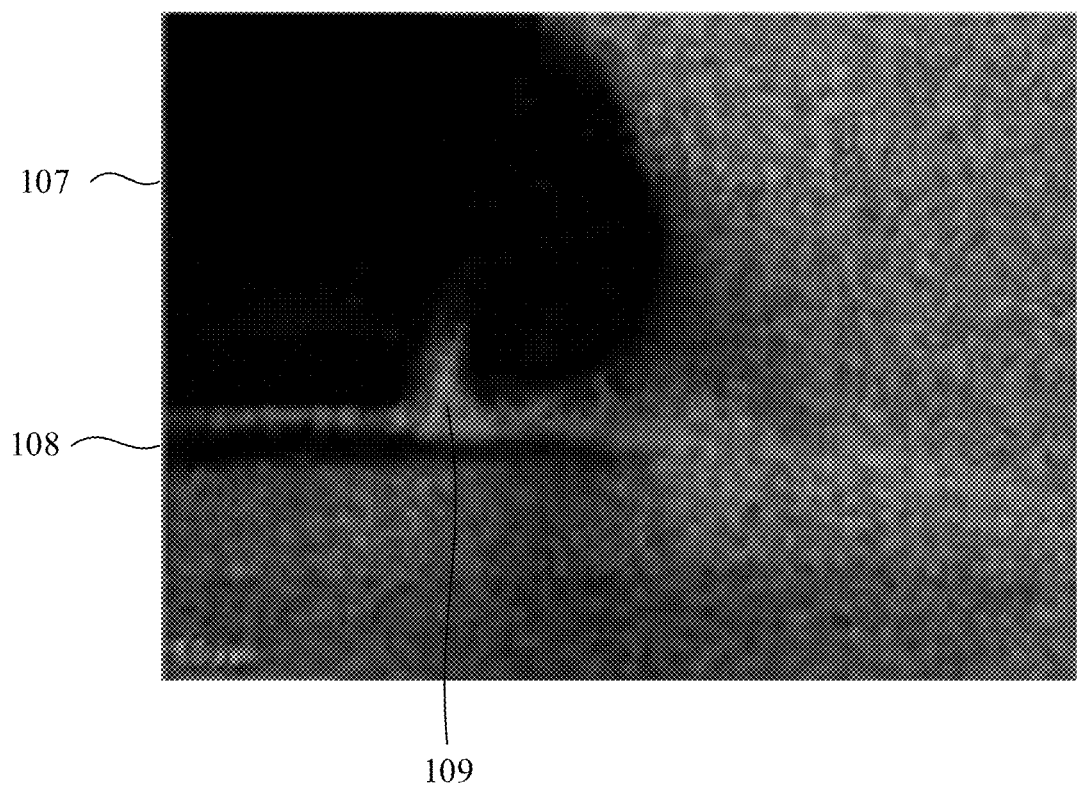
FIG. 3 is a schematic diagram of an actual structure of the region A shown in FIG. 1 according to an embodiment of the present disclosure.

It can be seen from FIG. 2 and FIG. 3 that slight regions of the metal-oxide layer 109 may include a tip portion 191 extending towards the interior of the bulk metal layer 107. In this case, the thickness of the metal-oxide layer 109 does not include a thickness of the tip portion 191.

Figure 4:
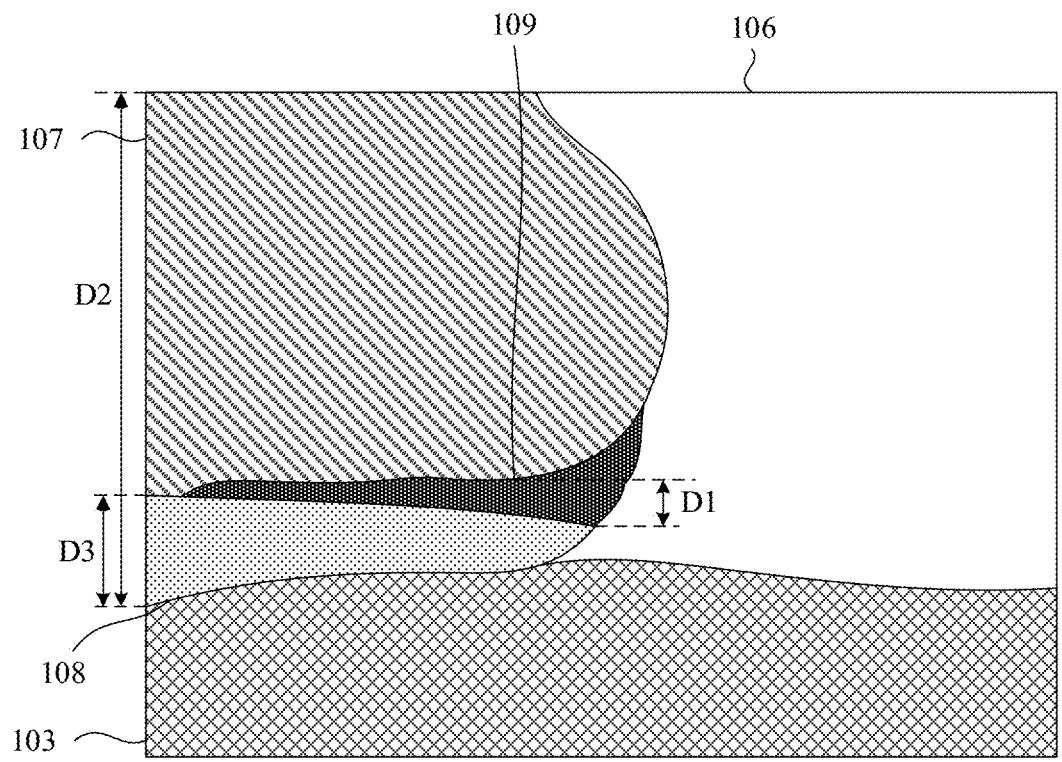
FIG. 4 is an enlarged view of another possible structure in the region A shown in FIG. 1.

An embodiment of the present disclosure shows the structure shown in FIG. 2 and FIG. 3 without the tip portion 191 extending towards the interior of the bulk metal layer 107, as shown in FIG. 4. FIG. 4 may be acquired by transmission electron microscope (TEM).

In the embodiments of the present disclosure, an oxygen element in the metal-oxide layer 109 is distributed between the electrode protection layer 108 and the bulk metal layer 107, and the oxygen element is distributed with a predetermined thickness, the predetermined thickness is the thickness of the metal-oxide layer 109. That is, the oxygen element is distributed in the metal-oxide layer 109.

The metal-oxide layer 109 of the source electrode 104 is a film layer of the metal oxide distributed in a direction away from the drain electrode 105, and the farther away from the drain electrode 105, the less the thickness of the metal oxide. It can be seen from FIG. 2 that the thickness of the metal-oxide layer 109 of the source electrode 104 is varied. The closer to the drain 105, the greater the thickness of the metal-oxide layer 109. The farther away from the drain electrode 105, the less the thickness of the metal-oxide layer 109.

The above embodiment may be further described as that the metal-oxide layer 109 extends from the region between the drain electrode and the source electrode to the drain electrode, and the thickness of the metal-oxide layer 109 is thinner in the extension direction.

As a gap in present between the electrode protection layer 108 and the bulk metal layer 107, the oxygen enters the interior from an edge of the gap, and the metal oxide at the edge of the gap is greater. The source electrode 104 and the drain electrode 105 are fabricated in the same layer, and the spaced source electrode 104 and the drain electrode 105 are formed by patterning such as etching, such that a groove is formed between the source electrode 104, the drain electrode 105, and the metal-oxide semiconductor layer. In this case, the etching process may affect the gap between the electrode protection layer 108 and the bulk metal layer 107, and enlarge the gap. Furthermore, the closer to the groove, the greater the oxygen element entering the gap, such that the thicknesses of the formed metal-oxide layers 109 are different. Therefore, the farther the metal-oxide layer 109 of the source electrode 104 from the drain electrode 105, the less the thickness of the metal oxide.

As such, the metal-oxide layer 109 of the drain electrode 105 is a film layer of the metal oxide distributed in a direction away from the source electrode 104. The farther away from the source electrode 104, the less the thickness of the metal oxide. A shape of the metal-oxide layer 109 of the drain electrode 105 is similar to a shape of the metal-oxide layer 109 of the source electrode 104, and the detail description is omitted herein.

In the embodiments of the present disclosure, the metal-oxide layer 109 of the source electrode 104 and/or the drain electrode 105 shows the structure shown in FIG. 2. The term "and/or" means at least one of the source electrode 104 and the drain electrode 105.

In the embodiments of the present disclosure, a portion of the metal oxide protruding from the source electrode 104 or the drain electrode 105 to a portion between a top of the electrode protection layer 108 and a bottom of the main metal layer 107 does not exceed an edge of the electrode protection layer 108. That is, an orthogonal projection of the metal-oxide layer 109 on a face of the base substrate 20 is within an orthogonal projection of the electrode protection layer 108 on the face of the base substrate 20. As shown in FIG. 2, a portion of the metal-oxide layer 109 protruding toward the left is within the edge of the electrode protection layer 108.

Due to poor conductivity of the metal oxide, in the case that the portion of the metal oxide protruding to the portion between the top of the electrode protection layer 108 and the bottom of the main metal layer 107 is greater, the conductivity of the source electrode 104 or the drain electrode 105 may be affected. Therefore, in the embodiments of the present disclosure, the portion of the metal oxide protruding to the portion between the top of the electrode protection layer 108 and the bottom of the main metal layer 107 does not exceed the edge of the electrode protection layer 108. In this case, the electrode protection layer 108 and the main metal layer 107 are not completely spaced by the metal-oxide layer 109, such that the source electrode 104 and the drain electrode 105 can be conducted when the metal-oxide thin-film transistor operates.

Illustratively, in a length direction of a channel, the portion of the metal oxide protruding to the portion between the top of the electrode protection layer 108 and the bottom of the main metal layer 107 and extending towards interior does not exceed the edge of the electrode protection layer 108.

In the case that the metal-oxide thin-film transistor is conducted, a current between the source electrode 104 and the drain electrode 105 flows in the length direction of the channel. The current is defined in the length direction of the channel, and the portion of metal oxide protruding toward the interior does not exceed the edge of the electrode protection layer 108, such that the current flows more smoothly.

In the embodiments of the present disclosure, an orthogonal projection of the source electrode 104 on the face of the base substrate 20 is partially overlapped with an orthogonal projection of the metal-oxide semiconductor layer 103 on the face of the base substrate 20. In the length direction of the channel a, a length L of the overlapped portion is not greater than 3.5 µm.

Illustratively, the length L of the overlapped portion is 3 µm.

As such, an orthogonal projection of the drain electrode 105 on the face of the base substrate 20 is partially overlapped with the orthogonal projection of the metal-oxide semiconductor layer 103 on the face of the base substrate 20. In the length direction of the channel a, a length L of the overlapped portion is not greater than 3.5 µm.

Figure 5:
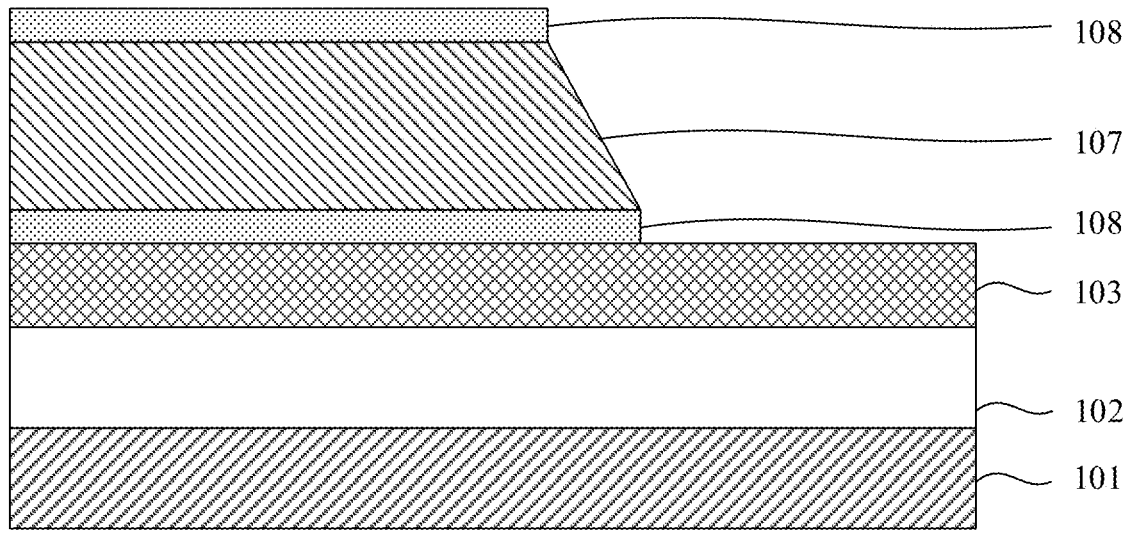
FIG. 5 is a schematic locally structural diagram of a metal-oxide thin-film transistor according to an embodiment of the present disclosure.

FIG. 5 is a schematic locally structural diagram of a metal-oxide thin-film transistor according to an embodiment of the present disclosure. Referring to FIG. 5, the laminated structure includes two electrode protection layers 108, and the two electrode protection layers 108 are disposed on two opposite side faces of the bulk metal layer 107 respectively.

In the case that the metal-oxide thin-film transistor operates, the bulk metal layer 107 is a main conduction layer of the source electrode 104 and the drain electrode 105, and two sides of the bulk metal layer 107 are both disposed with the electrode protection layer 108 to protect the bulk metal layer 107, such that the damage on the bulk metal layer 107 in etching may be avoided.

In the case that the laminated structure includes two electrode protection layers 108, it is fabricated in a sequence of the electrode protection layer 108, the bulk metal layer 107, and the electrode protection layer 108, and thus, the metal-oxide layer 109 is present between the bulk metal layer 107 and each the two electrode protection layers 108.

In the embodiments of the present disclosure, the definition on the thickness and length of the metal-oxide layer 109 is for the metal-oxide layer 109 between the bulk metal layer 107 and the electrode protection layer 108 in one of the source electrode 104 and the drain electrode 105.

In one implementation of the embodiments of the present disclosure, the electrode protection layer 108 is a molybdenum-niobium (MoNb) layer, and the bulk metal layer 107 is a copper (Cu) layer. The MoNb has a great corrosion resistance, and thus, may serve a great protection function. The Cu has a great conductivity, and thus, may ensure the conductive properties of the source electrode 104 and the drain electrode 105.

In this case, the metal-oxide layer 109 between the electrode protection layer 108 and the bulk metal layer 107 includes at least one of the oxides of copper, molybdenum, and niobium.

In the embodiments of the present disclosure, the thickness of the electrode protection layer 108 ranges from 20 nm to 30 nm, which may ensure the protection function of the electrode protection layer 108, and prevent thicker electrode protection layer 108 from affecting the yield and production cost of the display panel.

In the embodiments of the present disclosure, the thickness of the bulk metal layer 107 ranges from 400 nm to 600 nm, which may avoid less resistance of the bulk metal layer 107 caused by thinner bulk metal layer 107, and prevent thicker bulk metal layer 107 from affecting the yield and production cost of the display panel.

Illustratively, the thickness of the electrode protection layer 108 is 25 nm, and the thickness of the bulk metal layer 107 is 500 nm.

Figure 6:
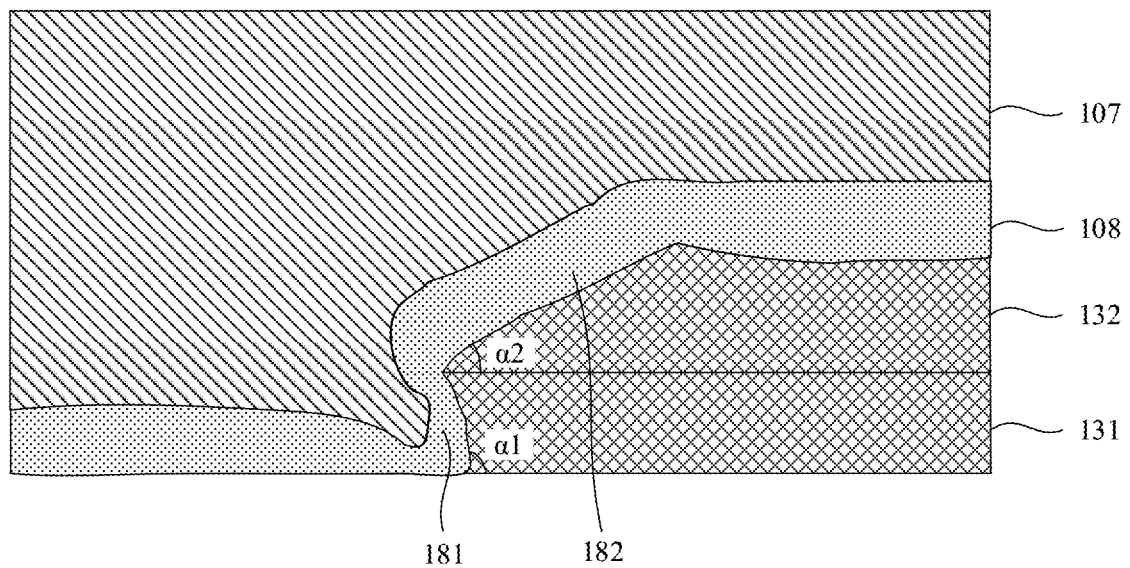
FIG. 6 is a schematic diagram of attaching an electrode protection layer and a metal-oxide semiconductor layer according to an embodiment of the present disclosure.
Figure 7:
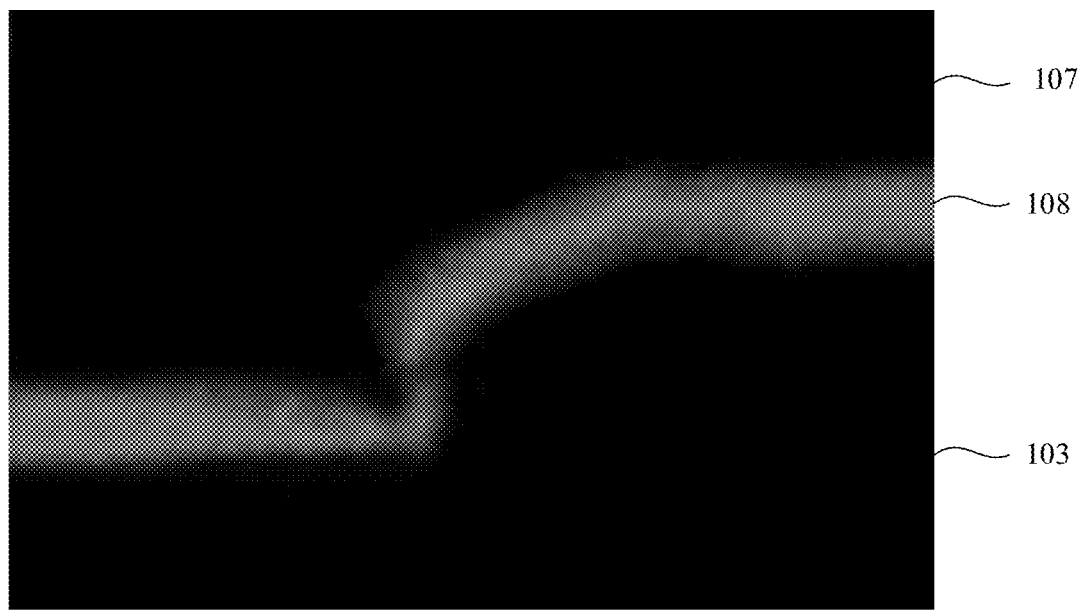
FIG. 7 is a schematic diagram of an actual structure of an electrode protection layer according to an embodiment of the present disclosure.

FIG. 6 is a schematic diagram of attaching an electrode protection layer and a metal-oxide semiconductor layer according to an embodiment of the present disclosure. Referring to FIG. 6, the electrode protection layer 108 includes a first portion 181 and a second portion 182 that are connected. The first portion 181 and the second portion 182 are both disposed on a side of the metal-oxide semiconductor layer 103, and in a direction perpendicular to the face of the base substrate, the second portion 182 is disposed above the first portion 181, and a slope angle α1 of the first portion 181 is greater than a slope angle α2 of the second portion 182. In the embodiments of the present disclosure, a bottom face of the metal-oxide semiconductor layer 103 is a face of the metal-oxide semiconductor layer 103 attaching to the gate insulation layer 102, a top face of the metal-oxide semiconductor layer 103 is a face of the metal-oxide semiconductor layer 103 opposite to the bottom face, and a side face of the metal-oxide semiconductor layer 103 is a face connecting the top face of the metal-oxide semiconductor layer 103 and the bottom face of the metal-oxide semiconductor layer 103.

In the embodiments of the present disclosure, in fabricating the metal-oxide semiconductor layer 103, a metal-oxide semiconductor thin film is formed, and then the metal-oxide semiconductor thin film is etched to form the metal-oxide semiconductor layer 103. In some embodiments, amounts to be etched on different positions on the metal-oxide semiconductor layer 103 are different. For example, for the side face of the metal-oxide semiconductor layer 103, the amount to be etched at bottom of the metal-oxide semiconductor layer 103 is greater, such that the bottom of the side face of the metal-oxide semiconductor layer 103 is recessed inwardly. As the electrode protection layer 108 wraps the side face of the metal-oxide semiconductor layer 103, the inward recess of the bottom of the side face of the metal-oxide semiconductor layer 103 may cause different slope angles of the electrode protection layer 108 at different positions. In the embodiments of the present disclosure, the second portion 182 is disposed above the first portion 181, the first portion 181 is attached to the bottom of the side face of the metal-oxide semiconductor layer 103, and the second portion 182 is attached to the top of the side face of the metal-oxide semiconductor layer 103, such that the slope angle of the first portion 181 is greater than the slope angle of the second portion 182. The inward recess of the side face of the metal-oxide semiconductor layer 103 means that the side face of the metal-oxide semiconductor layer 103 tends to incline inwardly.

In the embodiments of the present disclosure, the slope angle of the first portion 181 ranges from 80° to 100°, and the slope angle of the second portion 182 ranges from 30° to 60°.

The slope angle of the first portion 181 and the slope angle of the second portion 182 are defined within above ranges, such that the first portion 181 and the second portion 182 may wrap the side face of the metal-oxide semiconductor layer 103 and not be broken to affect the properties of the belonging electrode.

Illustratively, the slope angle of the first portion 181 and the slope angle of the second portion 182 may be acquired by TEM.

In the embodiments of the present disclosure, a thickness of the first portion 181 is less than a thickness of the second portion 182. The thickness of the first portion 181 is a thickness of the first portion 181 in a direction perpendicular to the inclined ramp face of the first portion 181, and the thickness of the second portion 182 is a thickness of the second portion 182 in a direction perpendicular to the inclined ramp face of the second portion 182.

As the bottom of the side face of the metal-oxide semiconductor layer 103 is recessed inwardly, materials of the electrode protection layer 108 of the source electrode and the drain electrode may be recessed inwardly at a position corresponding to the recessed portion in fabricating the electrode protection layer 108, such that materials of a position corresponding to the recessed portion are less, and the thickness of the first portion 181 corresponding to the recessed portion is less.

In some embodiments, referring to FIG. 6, the metal-oxide semiconductor layer 103 includes a first sub-metal-oxide semiconductor layer 131 and a second sub-metal-oxide semiconductor layer 132 that are laminated, and the first sub-metal-oxide semiconductor layer 131 is disposed between the base substrate 20 and the second sub-metal-oxide semiconductor layer 132.

The two sub-metal-oxide semiconductor layers are disposed, and the second sub-metal-oxide semiconductor layer 132 is disposed on a face, distal from the base substrate 20, of the first sub-metal-oxide semiconductor layer 131, such that the second sub-metal-oxide semiconductor layer 132 may protect the first sub-metal-oxide semiconductor layer 131 from being affecting in the subsequent etching process.

A crystallinity degree of the first sub-metal-oxide semiconductor layer 131 is less than a crystallinity degree of the second sub-metal-oxide semiconductor layer 132. In this case, in the same etching condition, an etch rate of the first sub-metal-oxide semiconductor layer 131 is greater than an etch rate of the second sub-metal-oxide semiconductor layer 132, the first portion 181 is attached to a side face of the first sub-metal-oxide semiconductor layer 131, and the second portion 182 is attached to a side face of the second sub-metal-oxide semiconductor layer 132.

As the etch rates of the first sub-metal-oxide semiconductor layer 131 and the second sub-metal-oxide semiconductor layer 132 are different in fabricating, and the etch rate of the first sub-metal-oxide semiconductor layer 131 is greater than the etch rate of the second sub-metal-oxide semiconductor layer 132, an amount to be etched in the first sub-metal-oxide semiconductor layer 131 is greater in the same etching condition. Therefore, the side face of the first sub-metal-oxide semiconductor layer 131 is recessed inwardly, so as to form the structure in FIG. 6.

In some embodiments, the metal-oxide semiconductor layer 103 may include a third sub-metal-oxide semiconductor layer, and the first sub-metal-oxide semiconductor layer 131, the second sub-metal-oxide semiconductor layer 132, and the third sub-metal-oxide semiconductor layer are successively laminated on the gate insulation layer 102.

A shape of the side face of the first sub-metal-oxide semiconductor layer 131 is associated with the etching condition. In one implementation of the embodiments of the present disclosure, the side face of the first sub-metal-oxide semiconductor layer 131 is a planar face, as shown in FIG. 6.

In some embodiments, the side face of the first sub-metal-oxide semiconductor layer 131 is a curved face.

In one implementation of the embodiments of the present disclosure, the metal oxide in the metal-oxide semiconductor layer 103 includes at least one of indium, gallium, zinc, stannum, and praseodymium. The oxides of indium, gallium, zinc, stannum, and praseodymium are excellent semiconductor material, and can ensure the properties of the metal-oxide semiconductor layer 103.

Illustratively, the metal oxide includes the IGZO.

In the embodiments of the present disclosure, a ratio of indium atoms, gallium atoms, and zinc atoms in the IGZO is 4:2:3, 1:3:6, or 1:1:1.

Optionally, the ratio of indium atoms, gallium atoms, and zinc atoms in the IGZO is 4:2:3, that is, a ratio of a number of indium atoms, a number of gallium atoms, and a number of zinc atoms in the IGZO is 4:2:3. Illustratively, a material of the metal-oxide semiconductor layer 103 may be $In_4Ga_2Zn_3O_x$.

In one implementation of the embodiments of the present disclosure, the first sub-metal-oxide semiconductor layer 131 includes an amorphous metal oxide or a nanocrystal metal oxide, and the second sub-metal-oxide semiconductor layer 132 includes a c-axis crystal metal oxide.

Optionally, a material of the first sub-metal-oxide semiconductor layer 131 may be amorphous or nanocrystal $In_4Ga_2Zn_3O_x$, and a material of the second sub-metal-oxide semiconductor layer 132 may be c-axis crystal $In_4Ga_2Zn_3O_x$.

In the embodiments of the present disclosure, a thickness of the first sub-metal-oxide semiconductor layer 131 ranges from 10 Å to 300 Å, and a thickness of the second sub-metal-oxide semiconductor layer 132 ranges from 10 Å to 400 Å.

In the embodiments of the present disclosure, an atom content of an oxygen element in the metal-oxide semiconductor layer 103 ranges from 50% to 70%.

In the related art, the atom content of the oxygen element in the metal-oxide semiconductor layer is generally less than 50%, such that a large amount of oxygen vacancies are present in the metal-oxide semiconductor layer 103. The large amount of oxygen vacancies may increase carriers in the metal-oxide semiconductor layer 103, such that the stability of the metal-oxide thin-film transistor is reduced. In the embodiments of the present disclosure, the atom content of the oxygen element in the metal-oxide semiconductor layer is increased to greater than 50%, such that the oxygen vacancies are reduced, the stability of the metal-oxide thin-film transistor is improved. In addition, the atom content of the oxygen element in the metal-oxide semiconductor layer 103 is defined as not greater than 70% to avoid enriched oxygen.

The atom content of the oxygen element in the metal-oxide semiconductor layer 103 may be acquired by a secondary ion mass spectroscopy (SIMS) analyzer, and is an actually measured data.

As electrons in the metal-oxide semiconductor material has a great electron mobility capacity, and a number of the oxygen vacancies affects the overall properties and the stability, the control of the oxygen vacancies in the metal-oxide semiconductor material is important. In the related art, as greater oxygen vacancies are present in the metal-oxide semiconductor layer, the stability of the metal-oxide thin-film transistor is poor, and the display panel of the display apparatus shows the undesirable display such as driving bright spots and products sand mura. The metal-oxide thin-film transistor in the embodiments of the present disclosure may solve above problem efficiently.

Figure 8:
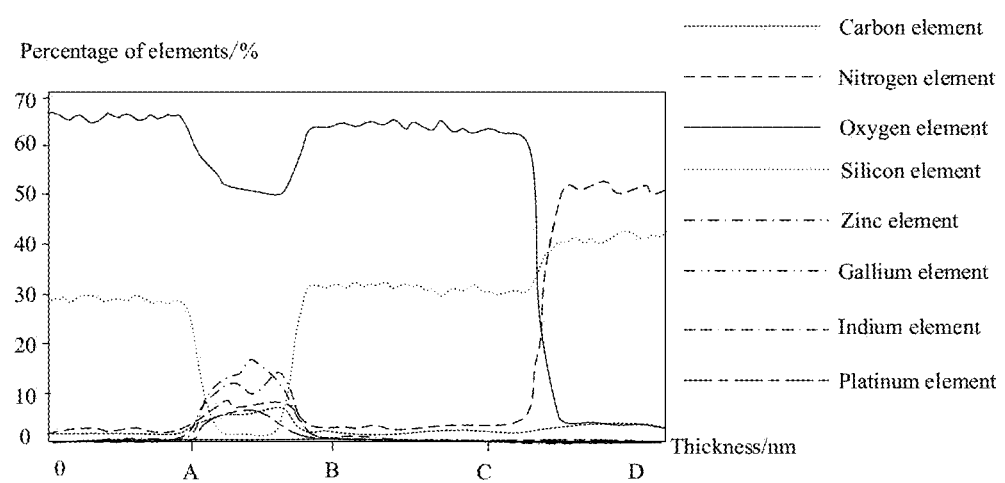
FIG. 8 is a plot of a ratio of various elements in a passivation layer, a metal-oxide semiconductor layer, and a gate insulation layer according to an embodiment of the present disclosure.

FIG. 8 is a plot of a ratio of various elements in a passivation layer, a metal-oxide semiconductor layer, and a gate insulation layer according to an embodiment of the present disclosure. FIG. 8 shows the ratio of various elements in the passivation layer, the metal-oxide semiconductor layer, and the gate insulation layer that are disposed in a metal-oxide thin-film transistor of a pixel in a non-sand mura region.

In FIG. 8, the ordinate illustrates the ratio of various elements with a unit of %, and the abscissa illustrates thicknesses of film layers with a unit of μm. Taking the passivation layer as 0, the passivation layer is from 0 to A, the metal-oxide semiconductor layer is from A to B, and the gate insulation layer is from B to C. It can be seen from FIG. 8 that the atom content of the oxygen element in the metal oxide is greater than 50% in the non-sand mura region.

In the embodiments of the present disclosure, when the ratios of various elements in the metal-oxide semiconductor layer (from A to B) are measured, the measurement position may be a position in the metal-oxide semiconductor layer 103 in the thickness direction, and two adjacent measurement positions may be adjacent positions in the metal-oxide semiconductor layer 103 in the thickness direction. It can be seen from FIG. 8 that a percentage plot of the numbers of the oxygen atoms at various measurement positions in the metal-oxide semiconductor layer 103 in the thickness direction is a consecutive plot, and thus, the measurement positions in the metal-oxide semiconductor layer 103 in the thickness direction may be consecutive measurement positions.

In addition, when ratios of the oxygen atoms at various measurement positions in the metal-oxide semiconductor layer 103 in the thickness direction are measured, an exterior sidewall of the metal-oxide semiconductor layer 103 may be directly measured after the metal-oxide semiconductor layer 103 is formed. A sidewall of the acquired the metal-oxide semiconductor layer 103 may be measured after the metal-oxide semiconductor layer 103 is cut in the thickness direction of the metal-oxide semiconductor layer 103, which is not limited in the embodiments of the present disclosure.

Figure 9:
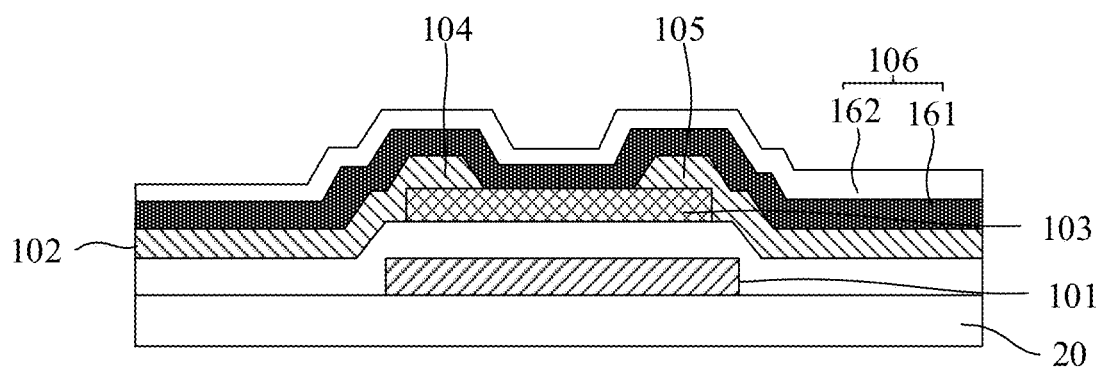
FIG. 9 is a schematic structural diagram of a metal-oxide thin-film transistor according to an embodiment of the present disclosure.

FIG. 9 is a schematic structural diagram of a metal-oxide thin-film transistor according to an embodiment of the present disclosure. Referring to FIG. 9, the passivation layer 106 includes a first sub-passivation layer 161 and a second sub-passivation layer 162 that are laminated, and the first sub-passivation layer 161 is disposed between the metal-oxide semiconductor layer 103 and the second sub-passivation layer 162.

By disposing two sub-passivation layers, the water and oxygen resistance of the passivation layer 106 is improved, such that the impurities, such as water vapor, hydrogen, and the like entering into the metal-oxide semiconductor layer 103 are reduced. Therefore, the carriers in the metal-oxide semiconductor layer 103 are reduced, the stability of the metal-oxide thin-film transistor is improved, and the undesirable display of the display device is improved.

The first sub-passivation layer 161 is an inorganic insulation film including at least silicon and oxygen. In actual measurement, the first sub-passivation layer 161 further includes slight nitrogen, and a ratio of the nitrogen is less. Therefore, the first sub-passivation layer 161 may be abbreviated as a silicon oxide ($SiO_x$) layer.

In the embodiments of the present disclosure, an atom content of the hydrogen element (H %) in the first sub-passivation layer 161 ranges from 2.5% to 3%. By defining the range of the atom content of the hydrogen element in the first sub-passivation layer 161, the hydrogen in the first sub-passivation layer 161 may be less. In fabricating process, the hydrogen entering into the metal-oxide semiconductor layer 103 is less, and the occupied oxygen in the semiconductor material is less, such that the oxygen vacancies in the semiconductor material is less, the carriers in the metal-oxide semiconductor layer 103 is less, and the effect on the stability of the metal-oxide thin-film transistor is reduced.

Table 1 shows a relationship of the atom contents of the hydrogen element in the first sub-passivation layer 161 and the undesirable display.

TABLE 1

| RP1 | First sub-passivation layer (PVX-1) | | |
| --- | --- | --- | --- |
| | Comparative Example | Present disclosure | |
| Uniformity of thickness | 18.7% | 11.5% | |
| Content of hydrogen at an edge | 4.1% | 1.7% | |
| Driving bright spot | 3.0% | 0.0% | 0.0% |
| Sand mura | 4.9% | 0.0% | 0.0% |

It can be seen from Table 1 that, in the case that the metal-oxide thin-film transistor in the embodiments of the present disclosure is applicable to the display device, the uniformity of thickness is reduced, but the driving bright spot and the sand mura are reduced to 0.0%, such that the undesirable display, such as the driving bright spot and the sand mura, is greatly reduced. The content of hydrogen at the edge of the first sub-passivation layer is reduced, which means the atom content of the hydrogen element in the first sub-passivation layer is reduced, and the atom content of the hydrogen element in the first sub-passivation layer ranges from 2.5% to 3%.

In the embodiments of the present disclosure, a peak bond energy of oxygen-silicon bonds (Si—O) in the first sub-passivation layer 161 is greater than 1060 cm$^{-1}$ and is not greater than 1080 cm$^{-1}$. Greater peak bond energy of oxygen-silicon bonds in the first sub-passivation layer 161 means greater contents of oxygen and silicon in the first sub-passivation layer 161, and thus, the atom content of hydrogen in the first sub-passivation layer 161 is less. The atom content of hydrogen in the first sub-passivation layer 161 is controlled by controlling the peak bond energy of oxygen-silicon bonds in the first sub-passivation layer 161.

Figure 10:
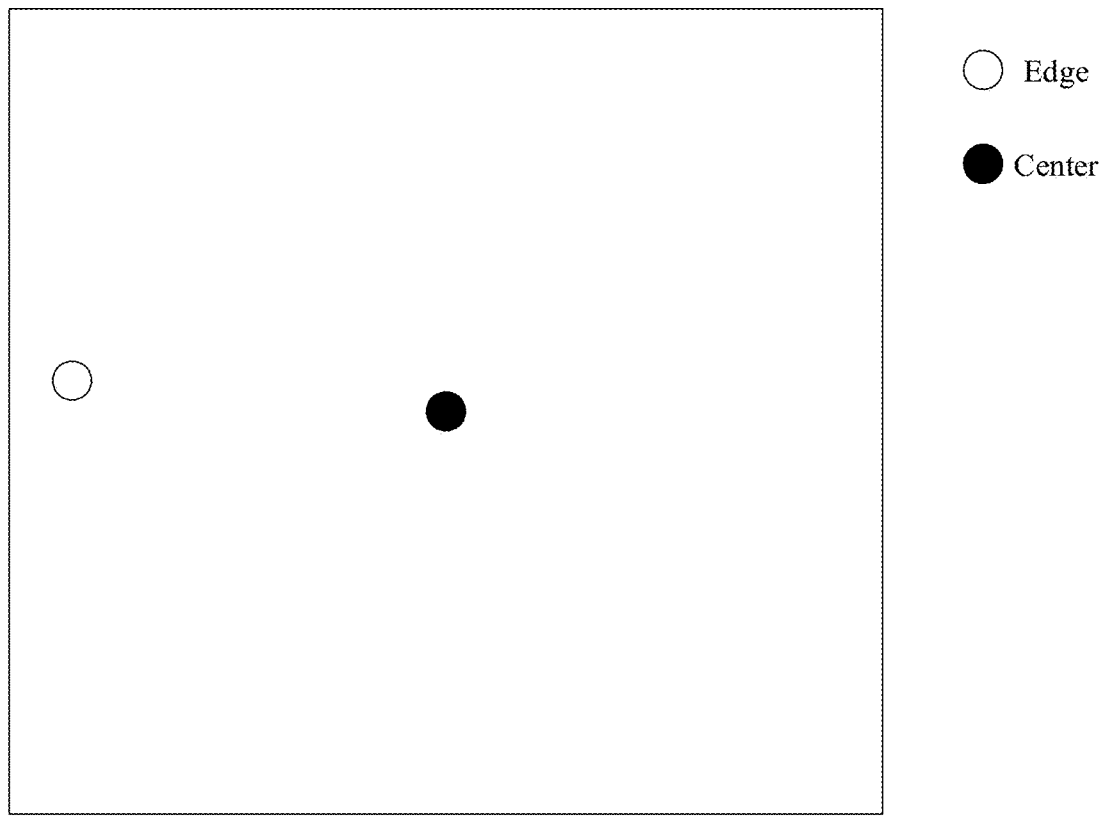
FIG. 10 is a schematic diagram of a measurement of a first insulation film formed on a large-sized base substrate according to an embodiment of the present disclosure.

In the embodiments of the present disclosure, the display panel may be manufactured on a large-sized base substrate, and a plurality of display panel are acquired by cutting. FIG. 10 is a schematic diagram of a measurement of a first insulation film formed on a large-sized base substrate according to an embodiment of the present disclosure. FIG. 10 is used to show that the percentage of hydrogen of the first sub-passivation layer formed on the large-sized base substrate may be measured at a center region and an edge region of the large-sized base substrate, and the peak bond energy of oxygen-silicon bonds of the first sub-passivation layer formed on the large-sized base substrate may be measured at a center region and an edge region of the large-sized base substrate.

Table 2 shows a relationship of the peak bond energy of oxygen-silicon bonds and the atom content of hydrogen in the first sub-passivation layer 161.

TABLE 2

| Measurement position | Peak bond energy of oxygen-silicon bond | Atom content of hydrogen (H %) |
| --- | --- | --- |
| Center region | 1060.7 | 2.9% |
| Edge region | 1053.0 | 4.1% |

It can be seen from Table 2 that, the peak bond energy of Si—O at the center region is greater than the peak bond energy of Si—O at the edge region. Thus, H % at the center region is less than H % at the edge region, and hydrogen at the center region reacted with the metal oxide is less. The greater the peak bond energy of Si—O, the less the atom content of hydrogen. In the case that the atom content of hydrogen in the first sub-passivation layer 161 is less than 3.0%, the peak bond energy of Si—O in the first sub-passivation layer 161 is greater than 1060 $cm^{-1}$.

Figure 11:
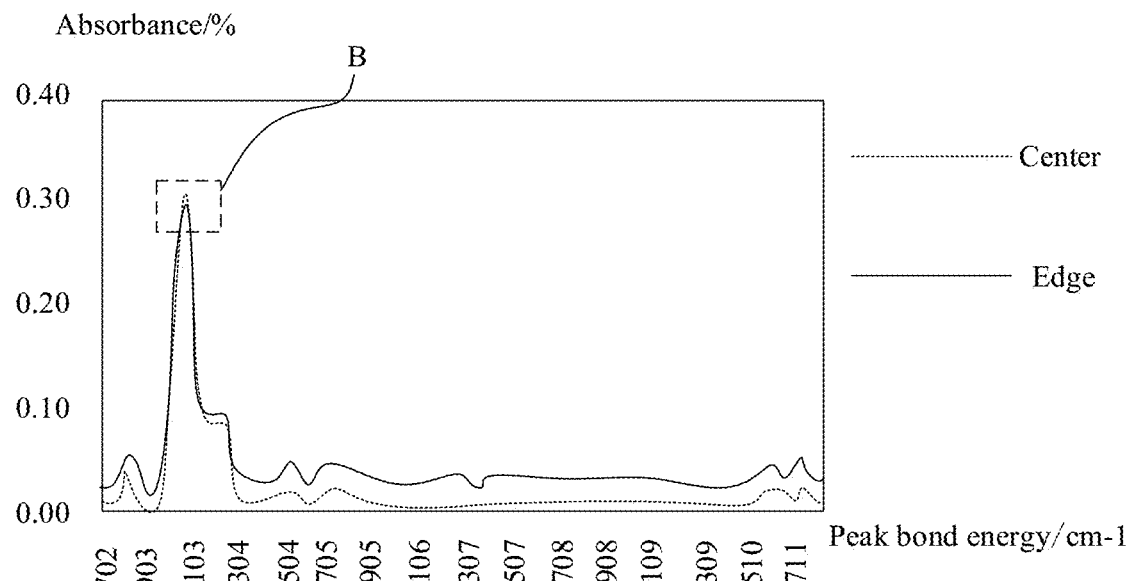
FIG. 11 is a schematic plot of a bond energy of a silicon-oxygen bond according to an embodiment of the present disclosure.

FIG. 11 is a schematic plot of a bond energy of a silicon-oxygen bond according to an embodiment of the present disclosure. It can be seen from Table 2 and FIG. 11 that, the peak bond energy of oxygen-silicon bonds of the first sub-passivation layer formed on the large-sized base substrate at the center region may be 1060.7 $cm^{-1}$, and the peak bond energy of oxygen-silicon bonds of the first sub-passivation layer formed on the large-sized base substrate at the edge region may be 1053.7 $cm^{-1}$.

It can be seen from the measurement results of the peak bond energy of oxygen-silicon bond and the atom content of hydrogen that, the peak bond energy of oxygen-silicon bonds at the center region is greater than the peak bond energy of oxygen-silicon bonds at the edge region, and the atom content of hydrogen at the center region is less than the atom content of hydrogen at the edge region (the atom content of hydrogen at the center region is less than 3%, and the atom content of hydrogen at the edge region is greater than 3%). Thus, in forming the first sub-passivation layer on the large-sized base substrate, a film quality of the first sub-passivation layer at the center region is greater than a film quality of the first sub-passivation layer at the edge region. That is, in the case that the size of the base substrate is less in fabricating process, the quality of the first sub-passivation layer is greater. Therefore, the small-sized base substrate is used to manufacture a small amount of display panel on the premise that the yield is ensured.

Figure 12:
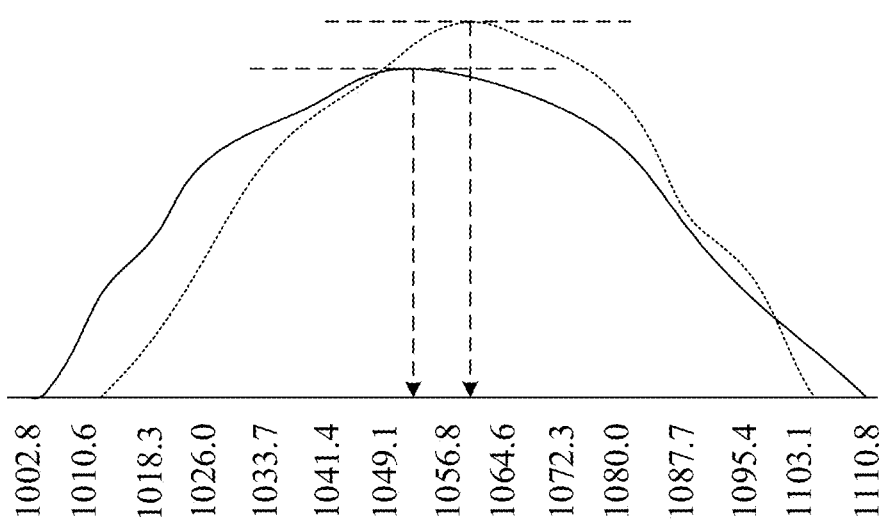
FIG. 12 is a schematic local diagram of a region B shown in FIG. 11.

In the embodiments of the present disclosure, in the case that the Si—O in the first sub-passivation layer 161 is measured by Fourier transform infrared spectroscopy (FTIR), the peak bond energy of Si—O may range from 1060 $cm^{-1}$ to 1080 $cm^{-1}$. FIG. 12 is a schematic local diagram of a region B shown in FIG. 11. Referring to FIG. 12, in the case that the Si—O in the first sub-passivation layer 161 is measured by FTIR, the peak bond energy of Si—O may range from 1063 $cm^{-1}$ to 1067 $cm^{-1}$. $cm^{-1}$ represents a number of waves within 1 cm. The peak bond energy of Si—O is used to represent the value bond energy at a maximum absorbance.

In the embodiments of the present disclosure, a thickness of the first sub-passivation layer 161 is less than 2000 Å. As the thickness of the first sub-passivation layer 161 is less, the yield of the first sub-passivation layer 161 is greater, the cost is reduced, and the productivity is improved. In addition, after the first sub-passivation layer 161 is formed, as the thickness of the first sub-passivation layer 161 is greater and the internal stress is greater in annealing, cracks in an overlapped region of the first sub-passivation layer 161 and the source electrode 104 or the drain electrode 105 may be avoided. As the cracks may expose the source electrode 104 or the drain electrode 105, the source electrode 104 or the drain electrode 105 may be oxidized due to the creaks, and the metal-oxide layer 109 in the source electrode 104 or the drain electrode 105 may be increased. In addition, the hydrogen in the layers above the source electrode 104 or the drain electrode 105 may enter into a face of the metal-oxide semiconductor layer 103 contacted with the source electrode 104 or the drain electrode 105 by the source electrode 104 or the drain electrode 105, such that the properties of the metal-oxide thin-film transistor is poor, and in severe cases, the sand mura is present the display panel.

In the embodiments of the present disclosure, the first sub-passivation layer 161 may be disposed on the base substrate 20 by a chemical vapor deposition apparatus. In addition, the gas for manufacturing the first sub-passivation layer 161 may include nitrous oxide ($N_2O$) and silicon hydride ($SiH_4$). The $N_2O$ and $SiH_4$ are reacted to generate silicon oxide. That is, the first sub-passivation layer 161 may be a monolayer silicon oxide film layer. The monolayer silicon oxide film layer may be film layers of the same quality manufactured by the same processing condition.

In some implementations, the second sub-passivation layer 162 may merely include a silicon oxide film layer, or merely include a $SiN_x$ film layer, or include a silicon oxide film layer and a $SiN_x$ film layer that are successively laminated on a side of the first sub-passivation layer 161, or include a silicon oxide film layer, a silicon oxynitride film layer, and a $SiN_x$ film layer that are successively laminated on a side of the first sub-passivation layer 161.

Optionally, an organic resin may be present between the first sub-passivation layer 161 and the second sub-passivation layer 162. Optionally, the organic resin may be not present between the first sub-passivation layer 161 and the second sub-passivation layer 162.

In some optional implementations, in the case that the second sub-passivation layer 162 merely includes the $SiN_x$ film layer, the first sub-passivation layer 161 and the second sub-passivation layer 162 may be distinguished based on the materials of the film layers. In addition, the second sub-passivation layer 162 may discharge the hydrogen in the $SiN_x$ film layer in annealing at high temperature.

Illustratively, on the premise that the metal-oxide thin-film transistor may satisfy basic requirements, the $SiN_x$ film layer may be directly formed on the first sub-passivation layer 161 (the first sub-passivation layer 161 is the monolayer silicon oxide film layer) to improve the yield and reduce the cost.

In some optional implementations, in the case that the requirements for the properties of the metal-oxide thin-film transistor is higher, a second silicon oxide film layer of different quality from a first silicon oxide film layer (the first sub-passivation layer 161 is the monolayer silicon oxide film layer, and the silicon oxide film layer is referred to as the first silicon oxide film layer) may be disposed on the first sub-passivation layer 161. In addition, the $SiN_x$ film layer is present on a side, the distal from the first sub-passivation layer 161, of the second silicon oxide film layer. The second silicon oxide film layer and the $SiN_x$ film layer may be in one second sub-passivation layer 162.

It is noted that the difference between the quality of the first silicon oxide film layer and the quality of the second silicon oxide film layer may be used to indicate at least one of the greater difference between the percentage of the oxygen in the first silicon oxide film layer and the percentage of the oxygen in the second silicon oxide film layer, the greater difference between the deposition rate of forming the first silicon oxide film layer and the deposition rate of forming the second silicon oxide film layer, and the greater difference between the compactness of the first silicon oxide film layer and the compactness of the second silicon oxide film layer.

Optionally, the thickness of the silicon oxide film layer in the second sub-passivation layer 162 may be greater than the thickness of the first sub-passivation layer 161. For example, the thickness of the silicon oxide film layer in the second sub-passivation layer 162 is 3000 Å, and the thickness of the $SiN_x$ film layer in the second sub-passivation layer 162 is 1000 Å.

In some optional implementations, the second sub-passivation layer 162 may include the silicon oxide film layer, the silicon oxynitride film layer, and the $SiN_x$ film layer that are laminated on the side of the first sub-passivation layer 161.

In the optional implementations, the function of the silicon oxide film layer in the second sub-passivation layer 162 may be the same as the function of second silicon oxide film layer in above implementations. In addition, the second sub-passivation layer 162 may discharge the hydrogen in the silicon oxynitride film layer and the $SiN_x$ film layer in annealing at high temperature, and supplement the metal-oxide semiconductor layer 103 with the oxygen in the first sub-passivation layer 161.

In the embodiments of the present disclosure, the key film layer that may prevent external hydrogen from entering is the second sub-passivation layer 162, and the structure of the second sub-passivation layer 162 may be the structure shown in above embodiments. That is, in the embodiments of the present disclosure, the first sub-passivation layer 161 (the monolayer silicon oxide film layer with a thickness less than 2000 Å) is not the first passivation layer (the silicon oxide film layer with a thickness from 3000 Å to 5000 Å) in the related art.

In the embodiments of the present disclosure, the content of oxygen-silicon bonds (Si—O) in the second sub-passivation layer 162 is less than 7%. The less the content of the oxygen-silicon bonds in the second sub-passivation layer 162, the less the hydrogen in the second sub-passivation layer 162. The atom content of the hydrogen in the second sub-passivation layer 162 is controlled by controlling the content of the oxygen-silicon bonds in the second sub-passivation layer 162.

In the embodiments of the present disclosure, the base substrate 20 may be a glass substrate or a polyimide (PI) substrate.

In the embodiments of the present disclosure, the material of the gate 101 includes at least one of nickel, a nickel-manganese alloy, a nickel-chromium alloy, and a nickel-molybdenum-iron alloy.

Figure 13:
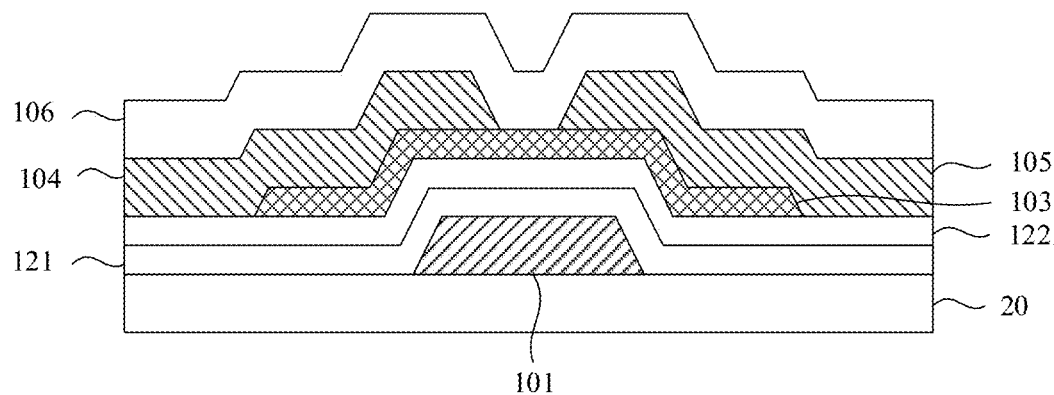
FIG. 13 is a schematic structural diagram of a metal-oxide thin-film transistor according to an embodiment of the present disclosure.

FIG. 13 is a schematic structural diagram of a metal-oxide thin-film transistor according to an embodiment of the present disclosure. Referring to FIG. 13, the gate insulation layer may include a first sub-gate insulation layer 121 and a second sub-gate insulation layer 122. The first sub-gate insulation layer 121 is attached to the gate 101, and the second sub-gate insulation layer 122 is attached to the metal-oxide semiconductor layer 103.

Illustratively, the first sub-gate insulation layer 121 is a $SiN_x$ layer, and the second sub-gate insulation layer 122 is a silicon oxide layer.

The technical solutions provided by the embodiments of the present disclosure have at least following beneficial effects.

In the embodiments of the present disclosure, for the metal-oxide layer between the electrode protection layer and the bulk metal layer, the thickness of the metal-oxide layer is defined as not greater than 2% of the thickness of any one of the source electrode and the drain electrode, and the thickness of the metal-oxide layer is not greater than 10% of the thickness of the electrode protection layer. A total amount of the metal-oxide layer in the metal-oxide thin-film transistor is reduced, such that the total amount of the metal oxide is reduced, the hydrogen bonds reacted with the metal oxide are reduced, the loss of the hydrogen bonds in the passivation layer is reduced, and the effect on the water and oxygen resistance of the passivation layer is reduced. Therefore, the water and oxygen resistance of the passivation layer is improved, and the corrosion of the metal-oxide thin-film transistor is reduced. In addition, the impurities, such as water vapor, hydrogen, and the like are not prone to enter into the metal-oxide semiconductor layer. Therefore, the carriers in the metal-oxide semiconductor layer are reduced, and the stability of the metal-oxide thin-film transistor is improved.

Figure 14:
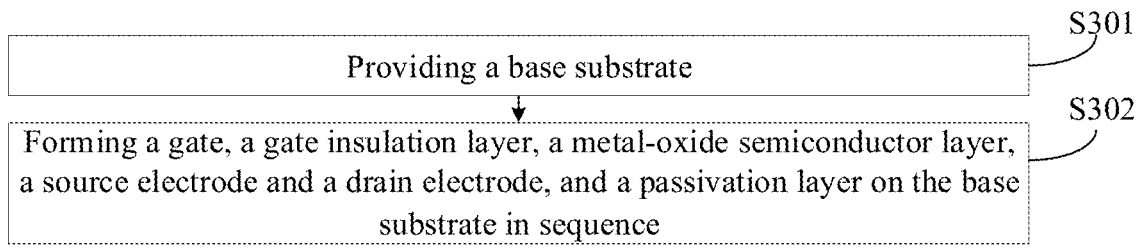
FIG. 14 is a flowchart of a method for fabricating a metal-oxide thin-film, transistor according to an embodiment of the present disclosure.

FIG. 14 is a flowchart of a method for fabricating a metal-oxide thin-film transistor according to an embodiment of the present disclosure. The method may be used to fabricate the metal-oxide thin-film transistor in above embodiments, for example, the metal-oxide thin-film transistor shown in FIG. 1. Referring to FIG. 14, the method may include the following processes.

In S301, a base substrate is provided.

Illustratively, the base substrate may be a glass substrate or a polyimide substrate.

In S302, a gate, a gate insulation layer, a metal-oxide semiconductor layer, a source electrode and a drain electrode, and a passivation layer are formed on the base substrate in sequence. The source electrode and the drain electrode are both in a laminated structure, and the laminated structure at least includes a bulk metal layer and an electrode protection layer. The electrode protection layer is disposed on at least one side of the bulk metal layer, and the electrode protection layer includes a metal or a metal alloy. The electrode protection layer is at least disposed between the metal-oxide semiconductor layer and the bulk metal layer, and a metal-oxide layer is disposed between the electrode protection layer and the bulk metal layer. The metal element of the metal-oxide layer includes at least one of the metal element of the bulk metal layer and the metal element of the electrode protection layer, a thickness of the metal-oxide layer is not greater than 2% of a thickness of any one of the source electrode and the drain electrode, and the thickness of the metal-oxide layer is not greater than 8% of a thickness of the electrode protection layer.

Figure 15:
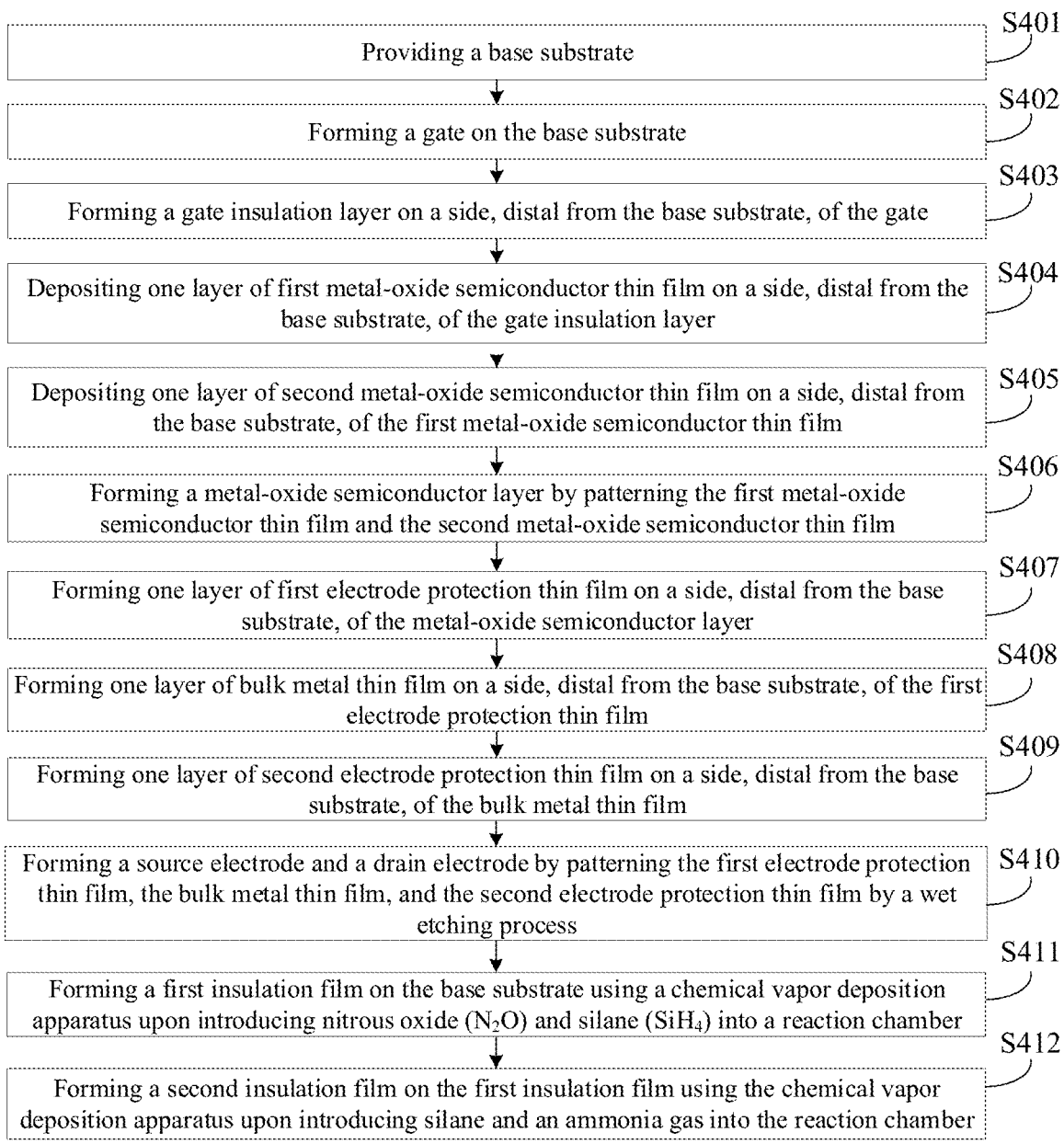
FIG. 15 is a flowchart of a method for fabricating a metal-oxide thin-film transistor according to an embodiment of the present disclosure.

FIG. 15 is a flowchart of a method for fabricating a metal-oxide thin-film transistor according to an embodiment of the present disclosure. Referring to FIG. 15, the method may include the following processes.

In S401, a base substrate is provided.

In S402, a gate is formed on the base substrate.

Illustratively, a gate thin layer may be formed on a side of the base substrate, and then the gate thin layer is patterned to acquire the gate.

In S403, a gate insulation layer is formed on a side, distal from the base substrate, of the gate.

Illustratively, after the gate is formed, the gate insulation layer may be formed on the side, distal from the base substrate, of the gate, such that the gate is insulated from subsequently formed source electrode and drain electrode.

Optionally, the gate insulation layer may include a first sub-gate insulation layer and a second sub-gate insulation layer that are laminated in a direction away from the base substrate. A material of the first sub-gate insulation layer may be $SiN_x$, and a material of the second sub-gate insulation layer may be silicon oxide.

In S404, one layer of first metal-oxide semiconductor thin film is deposited on a side, distal from the base substrate, of the gate insulation layer.

After the gate insulation layer is formed, one layer of first metal-oxide semiconductor thin film may be deposited on the side, distal from the base substrate, of the gate insulation layer. In addition, the first metal-oxide semiconductor thin film may cover the base substrate.

Optionally, the first metal-oxide semiconductor thin film may be deposited on the side, distal from the base substrate, of the gate insulation layer by a magnetron sputtering device. The first metal-oxide semiconductor thin film may be fabricated by a material with a greater mobility. For example, a material of the first metal-oxide semiconductor thin film is an amorphous metal oxide or a nanocrystal metal oxide.

Optionally, the material of the first metal-oxide semiconductor thin film may be amorphous or nanocrystal $In_4Ga_2Zn_3O_x$.

In the embodiments of the present disclosure, in the process of forming the first metal-oxide semiconductor thin film, a temperature for the base substrate may range from 100° C. to 200° C., a content of an oxygen element in a sputter gas of the magnetron sputtering device ranges from 1% to 30%, and a power of the magnetron sputtering device ranges from 10 kW to 40 kW. A thickness of the first metal-oxide semiconductor thin film ranges from 10 Å to 300 Å.

In S405, one layer of second metal-oxide semiconductor thin film is deposited on a side, distal from the base substrate, of the first metal-oxide semiconductor thin film.

Optionally, the second metal-oxide semiconductor thin film may be deposited on the side, distal from the base substrate, of the first metal-oxide semiconductor thin film by the magnetron sputtering device. A material of the second metal-oxide semiconductor thin film may be a c-axis crystal metal oxide.

Optionally, the material of the second metal-oxide semiconductor thin film may be c-axis crystal $In_4Ga_2Zn_3O_x$.

In the embodiments of the present disclosure, in the process of forming the second metal-oxide semiconductor thin film, a temperature for the base substrate may range from 100° C. to 300° C., a content of an oxygen element in a sputter gas of the magnetron sputtering device ranges from 80% to 100%, and a power of the magnetron sputtering device ranges from 10 kW to 40 kW. A thickness of the second metal-oxide semiconductor thin film ranges from 10 Å to 400 Å.

In S406, the metal-oxide semiconductor layer is formed by patterning the first metal-oxide semiconductor thin film and the second metal-oxide semiconductor thin film.

In the embodiments of the present disclosure, after the metal-oxide semiconductor thin film is formed, the metal-oxide semiconductor thin film may be patterned by a photolithography process to acquire the metal-oxide semiconductor layer. An orthogonal projection of the metal-oxide semiconductor layer on the base substrate is at least partially overlapped with an orthogonal projection of the gate on the base substrate. The photolithography process may include photoresist (PR) coating, exposure, developing, etching, and PR removal. The photolithography process may also be referred to as a mask process.

Optionally, the metal-oxide semiconductor thin film in S404 and S405 includes the first metal-oxide semiconductor thin film and the second metal-oxide semiconductor thin film. Therefore, patterning the metal-oxide semiconductor thin film in S406 may indicate patterning the first metal-oxide semiconductor thin film and the second metal-oxide semiconductor thin film. The first metal-oxide semiconductor layer may be acquired by patterning the first metal-oxide semiconductor thin film, and the second metal-oxide semiconductor layer may be acquired by patterning the second metal-oxide semiconductor thin film.

In the embodiments of the present disclosure, in the process of manufacturing the metal-oxide semiconductor layer, the addition of oxygen to the metal-oxide semiconductor layer is controlled to be greater than 55%, such that the atom content of the oxygen in the formed metal-oxide semiconductor layer is greater than 50%.

In S407, one layer of first electrode protection thin film is formed on a side, distal from the base substrate, of the metal-oxide semiconductor layer.

A thickness of the first electrode protection thin film is less than 25 nm.

In the embodiments of the present disclosure, after the metal-oxide semiconductor layer is acquired, the first electrode protection thin film may be formed on the side, distal from the base substrate, of the metal-oxide semiconductor layer. A material of the first electrode protection thin film may be molybdenum and niobium.

In S408, one layer of bulk metal thin film is formed on a side, distal from the base substrate, of the first electrode protection thin film.

Illustratively, a material of the bulk metal thin film may be copper.

In S409, one layer of second electrode protection thin film is formed on a side, distal from the base substrate, of the bulk metal thin film.

Illustratively, a material of the second electrode protection thin film may be molybdenum and niobium.

In S410, the source electrode and the drain electrode are formed by patterning the first electrode protection thin film, the bulk metal thin film, and the second electrode protection thin film by a wet etching process.

In the embodiments of the present disclosure, after the first electrode protection thin film, the bulk metal thin film, and the second electrode protection thin film are formed, the source electrode and the drain electrode may be acquired by patterning the source electrode and the drain electrode thin films by the photolithography process. In etching the source electrode and the drain electrode thin films, the wet etch rate (WER) may be performed on the source electrode and the drain electrode thin films with the etchant to acquire the source electrode and the drain electrode. In the embodiments, the source electrode and the drain electrode are acquired by one patterning process.

In the embodiments of the present disclosure, an amount to be etched in the WER is less than 50%, such that the source electrode and the drain electrode with perfect morphology are formed, and the first electrode protection thin film and the bulk metal thin film may not appear an undercut phenomenon. Therefore, the metal-oxide layer is reduced.

In the embodiments of the present disclosure, an orthogonal projection of the source electrode on the base substrate is overlapped with an orthogonal projection of the metal-oxide semiconductor layer on the base substrate, and an orthogonal projection of the drain electrode on the base substrate is overlapped with the orthogonal projection of the metal-oxide semiconductor layer on the base substrate.

In addition, thicknesses of the acquired source electrode and drain electrode may be greater than 3000 Å and less than 6000 Å, and slope angles of the acquired source electrode and drain electrode are less than 60°. The slope angle of the source electrode and the slope angle of drain electrode are designed to be less, such that cracks of the first insulation film formed on sides, distal from the base substrate, of the source electrode and the drain electrode may be avoided at ramps of the source electrode and the drain electrode, so as to ensure the yield of the metal-oxide thin-film transistor.

In S411, a first insulation film is formed on the base substrate using a chemical vapor deposition apparatus upon introducing nitrous oxide ($N_2O$) and silane ($SiH_4$) into a reaction chamber.

In the embodiments of the present disclosure, the film layers in the metal-oxide thin-film transistor may be fabricated in the reaction chamber. In fabricating the first insulation film, $N_2O$ and $SiH_4$ may be introduced into the reaction chamber. Optionally, a ratio of the content of $N_2O$ to the content of $SiH_4$ may be greater than 78. For example, the ratio of the content of $N_2O$ to the content of $SiH_4$ may be 80.

The ratio of the content of $N_2O$ to the content of $SiH_4$ may be designed to be greater, such that a peak value of oxygen-silicon bonds in the acquired first insulation film ranges from 1060 $cm^{-1}$ to 1080 $cm^{-1}$ in a Fourier transform infrared spectroscopy measurement. In general, in the case that the peak value of oxygen-silicon bond reaches to greater than 1060 $cm^{-1}$, the instability of the properties of the metal-oxide thin-film transistor caused by greater impurities in the first insulation film may be avoid.

In the embodiments of the present disclosure, the deposition rate of the first insulation film is associated with the deposition power and deposition pressure of the chemical vapor deposition apparatus, and the temperature of the base substrate.

Optionally, the deposition power and deposition pressure of the chemical vapor deposition apparatus may be less in forming the first insulation film. For example, the deposition power of the chemical vapor deposition apparatus ranges from 6 kW to 10 KW, and the deposition pressure of the chemical vapor deposition apparatus is less than 1000 mtorr. In forming the first insulation film, the temperature of the base substrate ranges from 200° C. to 250° C., such as 230° C.

Illustratively, a material of the first insulation film is $SiO_x$.

In S412, a second insulation film is formed on the first insulation film using the chemical vapor deposition apparatus upon introducing silane and an ammonia gas into the reaction chamber.

In the embodiments of the present disclosure, the second insulation film may be formed on a side, distal from the base substrate, of the first insulation film using the chemical vapor deposition apparatus. In addition, the conditions for fabricating the second insulation film are different from the conditions for fabricating the first insulation film. The second insulation film is an inorganic insulation film including nitride. For example, the second insulation film is a $SiN_x$ layer.

A display panel is further provided in the embodiments of the present disclosure. The display panel may include a base substrate, and a plurality of metal-oxide thin-film transistors, disposed on the base substrate, according to above embodiments. The metal-oxide thin-film transistor may be the metal-oxide thin-film transistor shown in any one of FIGS. 1 to 7, and 9 to 10.

Optionally, the display panel may further include pixel units disposed on a side, distal from the base substrate, of a second insulation film of the metal-oxide thin-film transistor. The pixel unit may include at least pixel electrodes, and a material of the pixel electrode may be an indium tin oxide (ITO).

Figure 16:
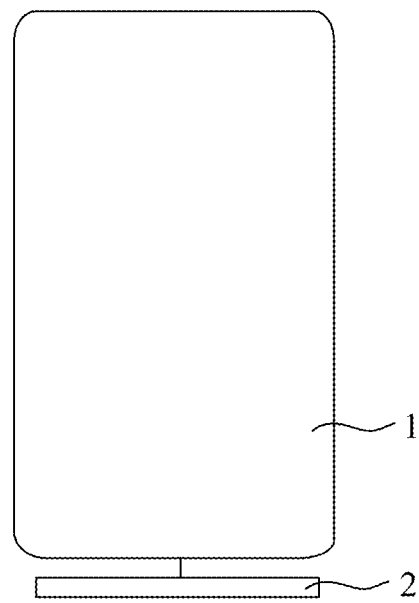
FIG. 16 is a schematic structural diagram of a display device according to an embodiment of the present disclosure.

FIG. 16 is a schematic structural diagram of a display device according to an embodiment of the present disclosure. Referring to FIG. 16, the display device may include a power supply assembly 2, and the display panel 1 according to above embodiments. The power supply assembly 2 is configured to supply power to the display panel 1.

Optionally, the display device may be any product or component with a display function and a fingerprint recognition function, such as electronic paper, mobile phone, tablet computer, television, monitor, notebook computer, digital photo frame, navigator, or the like.

Described above are example embodiments of the present disclosure, and are not intended to limit the present disclosure. Any modifications, equivalent replacements, improvements and the like made within the spirit and principles of the present disclosure should be included within the scope of protection of the present disclosure.

What is claimed is:

1. A metal-oxide thin-film transistor, comprising: a gate, a gate insulation layer, a metal-oxide semiconductor layer, a source electrode, a drain electrode, and a passivation layer that are successively disposed on a base substrate; wherein
    the source electrode and the drain electrode are both in a laminated structure, the laminated structure of the source electrode or the drain electrode at least comprising a bulk metal layer and an electrode protection layer; wherein
    the electrode protection layer is disposed on at least one side of the bulk metal layer, and the electrode protection layer comprises a metal or a metal alloy;
    the electrode protection layer of the source electrode or the drain electrode is at least disposed between the metal-oxide semiconductor layer and the bulk metal layer; and
    a metal-oxide layer is disposed between the electrode protection layer of the source electrode or the drain electrode and the bulk metal layer of the source electrode or the drain electrode, a metal element of the metal-oxide layer comprising at least one of a metal element of the bulk metal layer and a metal element of the electrode protection layer; wherein
    a thickness of the metal-oxide layer of the source electrode or the drain electrode is not greater than 2% of a thickness of any one of the source electrode and the drain electrode, and
    the thickness of the metal-oxide layer of the source electrode or the drain electrode is not greater than 10% of a thickness of the electrode protection layer.

2. The metal-oxide thin-film transistor according to claim 1, wherein
    the thickness of the metal-oxide layer of the source electrode or the drain electrode is not greater than 0.5% of the thickness of any one of the source electrode and the drain electrode; and
    the thickness of the metal-oxide layer of the source electrode or the drain electrode is not greater than 8% of the thickness of the electrode protection layer.

3. The metal-oxide thin-film transistor according to claim 1, wherein the thickness of the metal-oxide layer of the source electrode or the drain electrode is greater than 3 nm.

4. The metal-oxide thin-film transistor according to claim 1, wherein
    an oxygen element in the metal-oxide layer of the source electrode or the drain electrode is distributed between the electrode protection layer and the bulk metal layer, and the oxygen element is distributed within a predetermined thickness, the predetermined thickness being the thickness of the metal-oxide layer;
    the metal-oxide layer of the source electrode is a film layer of a metal oxide distributed in a direction away from the drain electrode, and the farther away from the drain electrode, the less the thickness of the metal oxide; and/or the metal-oxide layer of the drain electrode is a film layer of a metal oxide distributed in a direction away from the source electrode, the farther away from the source electrode, the less the thickness of the metal oxide.

5. The metal-oxide thin-film transistor according to claim 4, wherein a portion of the metal oxide protruding from a side edge of the source electrode or the drain electrode to a portion between the electrode protection layer and the main metal layer does not exceed an edge of the electrode protection layer.

6. The metal-oxide thin-film transistor according to claim 4, wherein in a length direction of a channel, a portion of the metal oxide protruding to a portion between a top of the electrode protection layer and a bottom of the main metal layer and extending towards interior does not exceed the edge of the electrode protection layer.

7. The metal-oxide thin-film transistor according to claim 1, wherein the electrode protection layer of the source electrode or the drain electrode comprises a first portion and a second portion that are connected; wherein the first portion and the second portion are both disposed on a side of the metal-oxide semiconductor layer, and in a direction perpendicular to a face of the base substrate, the second portion is disposed above the first portion, and a slope angle of the first portion is greater than a slope angle of the second portion.

8. The metal-oxide thin-film transistor according to claim 7, the metal-oxide semiconductor layer comprises a first sub-metal-oxide semiconductor layer and a second sub-metal-oxide semiconductor layer that are laminated; wherein
the first sub-metal-oxide semiconductor layer is disposed between the base substrate and the second sub-metal-oxide semiconductor layer;
a crystallinity degree of the first sub-metal-oxide semiconductor layer is less than a crystallinity degree of the second sub-metal-oxide semiconductor layer; and
the first portion is attached to a side of the first sub-metal-oxide semiconductor layer, and the second portion is attached to a side of the second sub-metal-oxide semiconductor layer.

9. The metal-oxide thin-film transistor according to claim 1, wherein an atom content of an oxygen element in the metal-oxide semiconductor layer ranges from 50% to 70%.

10. The metal-oxide thin-film transistor according to claim 1, wherein the passivation layer comprises a first sub-passivation layer and a second sub-passivation layer that are laminated; wherein
the first sub-passivation layer is disposed between the metal-oxide semiconductor layer and the second sub-passivation layer; and
an atom content of a hydrogen element in the first sub-passivation layer ranges from 2.5% to 3%, a content of oxygen-silicon bonds in the second sub-passivation layer is less than 7%, and a peak bond energy of oxygen-silicon bonds in the first sub-passivation layer is greater than 1060 $cm^{-1}$ and is not greater than 1080 $cm^{-1}$.

11. The metal-oxide thin-film transistor according to claim 1, wherein the laminated structure comprises two electrode protection layers; wherein
the two electrode protection layers are disposed on two opposite side faces of the bulk metal layer respectively; and
the electrode protection layer is a molybdenum-niobium layer, and the bulk metal layer is a copper layer.

12. The metal-oxide thin-film transistor according to claim 1, wherein the thickness of the electrode protection layer ranges from 20 nm to 30 nm, and a thickness of the bulk metal layer ranges from 400 nm to 600 nm.

13. The metal-oxide thin-film transistor according to claim 1, wherein a metal oxide in the metal-oxide semiconductor layer comprises at least one of indium, gallium, zinc, stannum, and praseodymium.

14. The metal-oxide thin-film transistor according to claim 13, wherein the metal oxide comprises an indium gallium zinc oxide, wherein a ratio of indium, gallium, and zinc is 4:2:3, 1:3:6, or 1:1:1.

15. A method for fabricating a metal-oxide thin-film transistor, comprising:
providing a base substrate; and
forming a gate, a gate insulation layer, a metal-oxide semiconductor layer, a source electrode, a drain electrode, and a passivation layer on the base substrate in sequence, wherein the source electrode and the drain electrode are both in a laminated structure, the laminated structure of the source electrode or the drain electrode at least comprising a bulk metal layer and an electrode protection layer; wherein the electrode protection layer is disposed on at least one side of the bulk metal layer, and the electrode protection layer comprises a metal or a metal alloy; the electrode protection layer of the source electrode or the drain electrode is at least disposed between the metal-oxide semiconductor layer and the bulk metal layer; and a metal-oxide layer is disposed between the electrode protection layer of the source electrode or the drain electrode and the bulk metal layer of the source electrode or the drain electrode, a metal element of the metal-oxide layer comprising at least one of a metal element of the bulk metal layer and a metal element of the electrode protection layer, a thickness of the metal-oxide layer of the source electrode or the drain electrode being not greater than 2% of a thickness of any one of the source electrode and the drain electrode, and the thickness of the metal-oxide layer of the source electrode or the drain electrode being not greater than 10% of a thickness of the electrode protection layer.

16. The method according to claim 15, wherein forming the metal-oxide semiconductor layer comprises:
depositing one layer of first metal-oxide semiconductor thin film on a side, distal from the base substrate, of the gate insulation layer, wherein the first metal-oxide semiconductor thin film comprises an amorphous metal oxide or a nanocrystal metal oxide, a temperature for depositing the first metal-oxide semiconductor thin film ranges from 100° C. to 200° C., a content of an oxygen element in a deposition gas ranges from 1% to 30%, and a deposition power ranges from 10 KW to 40 KW;
depositing one layer of second metal-oxide semiconductor thin film on a side, distal from the base substrate, of the first metal-oxide semiconductor thin film, wherein the second metal-oxide semiconductor thin film comprises a c-axis crystal metal-oxide, a temperature for depositing the second metal-oxide semiconductor thin film ranges from 100° C. to 300° C., a content of an oxygen element in a deposition gas ranges from 80% to 100%, and a deposition power ranges from 10 KW to 40 KW; and forming the metal-oxide semiconductor layer by patterning the first metal-oxide semiconductor thin film and the second metal-oxide semiconductor thin film.

17. The method according to claim 15, wherein forming the source electrode and the drain electrode comprises:
   forming one layer of first electrode protection thin film on a side, distal from the base substrate, of the metal-oxide semiconductor layer, wherein a thickness of the first electrode protection thin film is less than 25 nm;
   forming one layer of bulk metal thin film on a side, distal from the base substrate, of the first electrode protection thin film;
   forming one layer of second electrode protection thin film on a side, distal from the base substrate, of the bulk metal thin film; and
   forming the source electrode and the drain electrode by patterning the first electrode protection thin film, the bulk metal thin film, and the second electrode protection thin film by a wet etching process.

18. The method according to claim 15, wherein forming the passivation layer comprises:
   forming a first insulation film on the base substrate using a chemical vapor deposition apparatus upon introducing nitrous oxide and silane into a reaction chamber, wherein a thickness of the first insulation film ranges from 50 nm to 200 nm; in forming the first insulation film, a deposition power of the chemical vapor deposition apparatus ranges from 6 KW to 10 KW, a deposition pressure of the chemical vapor deposition apparatus is less than 1000 mtorr, a temperature of the base substrate is less than 230° C., and a ratio of a content of the nitrous oxide to a content of the silane is greater than 80; and the first insulation film forms a first sub-passivation layer; and
   forming a second insulation film on the first insulation film using the chemical vapor deposition apparatus upon introducing silane and an ammonia gas into the reaction chamber, wherein a thickness of the second insulation film is less than 100 nm; in forming the second insulation film, a deposition power of the chemical vapor deposition apparatus ranges from 6 KW to 10 KW, a deposition pressure of the chemical vapor deposition apparatus is less than 1000 mtorr, a temperature of the base substrate is greater than 280° C.; and the second insulation film forms a second sub-passivation layer, and the first sub-passivation layer and the second sub-passivation layer form the passivation layer.

19. A display panel, comprising: a base substrate, and a plurality of metal-oxide thin-film transistors, disposed on the base substrate, wherein
   the metal-oxide thin-film transistor comprises: a gate, a gate insulation layer, a metal-oxide semiconductor layer, a source electrode, a drain electrode, and a passivation layer that are successively disposed on a base substrate; wherein
   the source electrode and the drain electrode are both in a laminated structure, the laminated structure of the source electrode or the drain electrode at least comprising a bulk metal layer and an electrode protection layer; wherein
   the electrode protection layer is disposed on at least one side of the bulk metal layer, and the electrode protection layer comprises a metal or a metal alloy;
   the electrode protection layer of the source electrode or the drain electrode is at least disposed between the metal-oxide semiconductor layer and the bulk metal layer; and
   a metal-oxide layer is disposed between the electrode protection layer of the source electrode or the drain electrode and the bulk metal layer of the source electrode or the drain electrode, a metal element of the metal-oxide layer comprising at least one of a metal element of the bulk metal layer and a metal element of the electrode protection layer; wherein
   a thickness of the metal-oxide layer of the source electrode or the drain electrode is not greater than 2% of a thickness of any one of the source electrode and the drain electrode, and
   the thickness of the metal-oxide layer of the source electrode or the drain electrode is not greater than 10% of a thickness of the electrode protection layer.

20. A display device, comprising: a power supply assembly, and the display panel as defined in claim 19, wherein the power supply assembly is configured to supply power to the display panel.

* * * * *